United States Patent
Ogura et al.

(10) Patent No.: US 6,804,149 B2
(45) Date of Patent: Oct. 12, 2004

(54) NONVOLATILE MEMORY CELL, OPERATING METHOD OF THE SAME AND NONVOLATILE MEMORY ARRAY

(75) Inventors: Seiki O. Ogura, Wappingers Falls, NY (US); Yutaka Hayashi, Tsukuba (JP)

(73) Assignee: New Halo, Inc., Tokyo (JP)

( * ) Notice: Subject to any disclaimer, the term of this patent is extended or adjusted under 35 U.S.C. 154(b) by 0 days.

(21) Appl. No.: 10/101,659

(22) Filed: Mar. 20, 2002

(65) Prior Publication Data

US 2002/0149060 A1 Oct. 17, 2002

Related U.S. Application Data

(62) Division of application No. 09/595,059, filed on Jun. 16, 2000, now Pat. No. 6,388,293.
(60) Provisional application No. 60/158,966, filed on Oct. 12, 1999.

(51) Int. Cl.[7] .............................................. G11C 16/04
(52) U.S. Cl. ............................ 365/185.18; 365/185.14
(58) Field of Search ......................... 365/185.18, 185.14

(56) References Cited

U.S. PATENT DOCUMENTS 5,905,674 A * 5/1999 Choi ........................ 365/185.1
6,399,441 B1 * 6/2002 Ogura et al. ................ 365/218
6,438,036 B2 * 8/2002 Seki et al. ............. 365/185.22
6,541,326 B2 * 4/2003 Fujiwara ................ 365/185.11

* cited by examiner

Primary Examiner—Van Thu Nguyen
Assistant Examiner—Tuan T. Nguyen
(74) Attorney, Agent, or Firm—George O. Saile; Stephen B. Ackerman; Rosemary L.S. Pike

(57) ABSTRACT

The present invention relates to a nonvolatile memory cell and/or array and a method of operating the same high integrated density nonvolatile memory cell enabling high integration density, low voltage programming and/or high speed programming, a method of programming same and a nonvolatile memory array.

A p-well 101 is formed in a surface of a substrate 10 and a channel forming semiconductor region 110 is defined in a surface of the p-well 101 and separated by a first n+ region 121 and a second n+ region 122. A carrier-supplying portion (CS: carrier supply) 111 is formed coming into contact with the first n+ region 121 and a carrier-acceleration-injection portion 112 (AI: acceleration and injection) is in contact with the second n+ region 122 in the channel forming semiconductor region 110 wherein the carrier-supplying portion 111 and carrier-acceleration-injection portion 112 are in contact with each other.

14 Claims, 19 Drawing Sheets

|  | <AT TIME OF PROGRAM> | <AT TIME OF READING> |
|---|---|---|
| WORD LINE (Lw) | $V_{wpr1}$ ---- $V_{th1}$ | ---- $V_{th1}$ |
| BIT LINE (LB) | $V_{Bpr}$ ---- $V_{Bpr1}$ ---- $V_{wpr1}-V_{th1}$ ---- $V_{Bpr0}$ | $i_{BRD}$ $V_{BRD}$ ---- $i_{BRD}$ |
| COMMON LINE (Lc) | $V_B-2\phi F2$ ---- |  |
| CONTROL LINE (Ls) | $V_{G2B}(V_B-\phi_{GB})$ ---- | ---- $V_{CRD}$ |

*FIG. 8*

NONVOLATILE MEMORY CELL, OPERATING METHOD OF THE SAME AND NONVOLATILE MEMORY ARRAY

This is a division of patent application Ser. No. 09/595,059, filing date Jun. 16, 2000, Now U.S. Pat. No. 6,388,293 NONVOLATILE MEMORY CELL, OPERATING METHOD OF THE SAME AND NONVOLATILE MEMORY ARRAY, assigned to the same assignee as the present invention, which claims the benefit of Provisional application Ser. No. 60/158,966, filed Oct. 12, 1999.

BACKGROUND OF THE INVENTION

Field of the Invention

The present invention relates to a nonvolatile memory cell, a nonvolatile memory array and a method of operating the same, and more particularly to a nonvolatile memory cell and/or array and a method of operating the same enabling high integration density, low voltage programming and/or high speed programming.

A MNOS memory is one of typical semiconductor memories wherein carrier charge is stored in a gate insulator to have information nonvolatilely stored. The MNOS memory is of a laminated structure comprising a conductive gate (M), a silicon nitride film (N), a tunnel oxide film (O) and a semiconductor wherein the carrier (electron or hole) is captured at a trapping level in the silicon nitride film to store the carrier charge. In this step, the silicon nitride film of the MNOS memory was required to be more than 19 nm in thickness since the charge trapping efficiency depended on the carrier capture distance in the silicon nitride film (Document 1: F. L. Hampton and J. R. Cricchi "Space charge distribution limitation of scale down of MNOS devices", 1979 *IEDM Technical Digest*, p. 374).

To program (write or erase) the MNOS memory, at least more than 10V or about 20V as a normal value of programming voltage was required for a electric field to be fed to a semiconductor surface via the silicon nitride film so that a carrier may be injected in the nitride film through (via a tunnel) the tunnel oxide film. Also, a MONOS memory is disclosed as the nonvolatile memory capable of reducing the programming voltage (Document 2: E. Suzuki, H. Hiraishi, K. Ishii and Y. Hayashi, "A Low-Voltage Alterable EEPROM with Metal-Oxide-nitride-Oxide and semiconductor (MONOS) Structures", *IEEE Transaction on Electron Devices*, Vol. ED-30, February 1983, p. 122). This MONOS memory is of a laminated structure comprising a conductive gate (M), a top oxide film (O), a silicon nitride film (N), a tunnel oxide film (O) and semiconductor. This structure has enabled the MONOS memory to stop hopping via the carrier trapping level in the silicon nitride film due to a potential barrier formed between the nitride film and the top oxide film, which resulted in making the nitride film as thin as possible. Further, carrier traps newly generated at the interface between the top oxide film and nitride film has enlarged a memory window to the extent it is possible to identify the stored information even if the entire insulator thickness is made thinner.

This MONOS memory has made it possible to reduce the programming voltage down to 9V with the usable programming speed (0.1 msec) under the condition that the stored information is maintained for ten years (Document 3: T. Nozaki, T. Tanaka, Y. Kijiya, E. Kinoshita, T. Tsuchiya and Y. Hayashi, "Al-Mb EEPROM with MONOS Memory Cell for Semiconductor Disk Application", *IEEE Journal of Solid-State Circuits*, Vol.26, No.4, April, 1991, p.497). It has yet to be disclosed, however, whether or not it is possible to reduce a programming voltage to be less than 9V under the condition that the programming speed is less than 0.1 msec and memory retention characteristics are maintained. To achieve the programming voltage of less than 9V, either programming speed or memory storage characteristics or both were required to be sacrificed.

Disclosed is a technology to integrate a single transistor cell with a single gate (to be connected to a word line) in the form of an array to improve integration density which is more excellent than that disclosed in the Document 3 as described above. However, since it was required to supply electrical potential to not only a drain region but also a source region so as not to write in an unselected cell which results in separately connecting both drain and source regions to a bit line direction, it was impossible to improve the integration density even if a single gate structured single transistor cell is used therein. (Document 4: I. Fujiwara, H. Aozasa, A. Nakamura, Y. Komatsu, and Y. Hayashi, "0.13 $\mu$m MONOS single transistor memory cell with separated source", 1998 *IEDM Technical Digest*, 36.7, p995-998, FIG. 2 & 11).

When integrating a single gate cell in the form of an array to read the stored information, there is deterioration of memory retention characteristics called "read disturb" since electrical potential for reading the stored information is to be supplied to a gate.

To prevent the deterioration of the retention characteristics as described above and to keep the stored information well trapped even in the state of electrical potential being supplied to a gate, it was required to increase the thickness of the above-indicated tunnel oxide film from 2.0 nm to 2.7 nm. To make as minimal as possible the programming speed deterioration due to the increase of a tunnel oxide film thickness, it was necessary to increase programming voltage from 9V to 12 V.

Meanwhile, disclosed is technology of ballistic carrier injection for a floating gate memory cell which is intended to enable reduction of programming voltage and increase of programming speed (Document 5: S. Ogura, A. Hori, J. Kato, M. Yamanaka, S. Odanaka, H. Fujimoto, K. Akamatsu, T. Ogura, M. Komiya and H. Kotani, "Low voltage, Low current, High speed Program Step Split Gate Cell with Ballistic Direct Injection for EEPROM/Flash", 1998 *IEDM Technical Digest*, 36.5, p.987–990). The ballistic carrier injection as described above has such a configuration that formed in the form of a step in a surface of a semiconductor substrate is a thin drain region through which a hot carrier is ballistically transported to a floating gate and the floating gate is disposed to cover the step portion. This improves the injection efficiency since the speed component in the carrier transport direction contributes to generating energy for the carrier injection.

However, the carrier injection and discharge of a conventional MONOS nonvolatile memory are carried out in an entire surface of a channel forming a semiconductor region beneath a gate insulator in which carrier charge trapping function is incorporated and it was not known from the carrier injection in a floating gate memory cell whether or not current or voltage sensed at time of reading the memory cell was controlled by the carrier☐ charge in the gate insulator trapped by local carrier injection in source/drain directions in a channel forming semiconductor region. Neither was it possible to clearly read that the carrier charge injected through the above-mentioned thin drain resulted in changing current and voltage in the conventional MONOS nonvolatile memory.

With respect to a conventional floating gate memory, it is liable to cause defective bits if even one location of a gate insulator is found to be defective which results in deteriorating the memory retention characteristics of an entire cell. In addition, the ratio of the total capacitance of a floating gate to the capacitance between a control gate and floating gate decreases as a memory structure becomes fine. To eliminate the disadvantage as described above, it was required to adopt such a structure as to increase the overlapped area between the control gate and floating gate and further, there was no choice but to increase a number of manufacturing process steps and cell area.

SUMMARY OF THE INVENTION

It is a purpose of the present invention to resolve problems in the conventional technology and provide a nonvolatile memory cell which is not only capable of programming with lower voltage but also has a remote possibility of causing defective bits and has fewer manufacturing process steps compared to a conventional floating gate memory; a method of using the same and a nonvolatile memory array.

To achieve the purpose as described above, the present invention is provided with the means featured below:

A nonvolatile memory cell wherein first and second impurity regions of opposite conductivity type are formed in a main surface of a substrate and separated therebetween by a channel forming semiconductor region of one conductivity type in the main surface of the substrate and a gate electrode is formed on a gate insulator on the channel forming semiconductor region, carriers being injected and stored in a carrier trapping means of the gate insulator further comprising:

(a) provided is an acceleration-electrical potential supplying means to selectively supply the acceleration-electrical potential to one out of the first and second impurity regions at one side;

(b) the channel forming semiconductor region includes a carrier-supplying portion and carrier-acceleration-injection portion disposed along the carrier transport direction;

(c) the carrier-supplying portion supplies to the carrier-acceleration-injection portion carriers supplied by the other one out of the first and second impurity regions at the other side; and □□ (d) the carrier-acceleration-injection portion makes local injection of carriers supplied from the carrier-supplying portion into the gate insulator in the vicinity of the adjacent other one out of first and second impurity regions at one side to which the accelerated electrical potential is supplied: and (e) the gate insulator is provided with at least a carrier charge trapping means in a projecting area of the carrier-acceleration-injection portion.

According to the features as described above, a space charge region is extended from a second impurity region to a carrier-acceleration-injection portion by electric field due to electrical potential supplied to a second impurity region. Out of carriers supplied to the carrier-acceleration-injection portion, energy is supplied by the electrical potential difference in the space charge region to a carrier which is moved as far as near the interface with the second impurity region without being affected by lattice scattering and the aforesaid carrier is injected, that is, locally injected in a very narrow region of the carrier charge trapping means getting over a potential barrier formed at the interface with the gate insulator.

More particularly, it is possible to supply to a carrier energy getting over the potential barrier $V_B$ between a gate insulator and carrier-acceleration injection portion with the distance three times the mean free path of a high energy carrier by disposing a carrier-acceleration-injection portion in a channel forming semiconductor region. The shorter the distance within which energy is supplied to a carrier (and which generates electrical potential difference of $V_B$), the more the carrier number getting over the electrical potential increases. However, as the distance becomes shorter, probability of a carrier tunneling increases due to high electric field and the lower limit of the distance is determined as a value (near to the aforementioned three times the mean free path of a high energy carrier) to prevent the useless current increase due to the increase of the carrier tunneling. If the distance within which the energy is supplied to the carrier (which generates the electrical potential difference of $V_B$) exceeds fourteen times the mean free path of the high energy carrier, the injection efficiency is almost the same as that of the conventional channel hot electron injection.

Meanwhile, it is possible to read the information trapped in a cell by detecting a cell current or cell threshold voltage even if a carrier charge is not trapped in an entire region of a gate insulator having carrier charge trapping function. For example, it is possible to read the information if the carrier charge is trapped in a length (to the direction connecting a first impurity region and second impurity region) of the gate insulator which is more than 20 nm long out of gate insulators.

BRIEF DESCRIPTION OF THE DRAWINGS

FIG. 8 is a signal waveform illustration showing a programming and reading method for a memory array in FIG. 4.

DETAILED DESCRIPTION OF THE PREFERRED EMBODIMENTS

Figure 1:
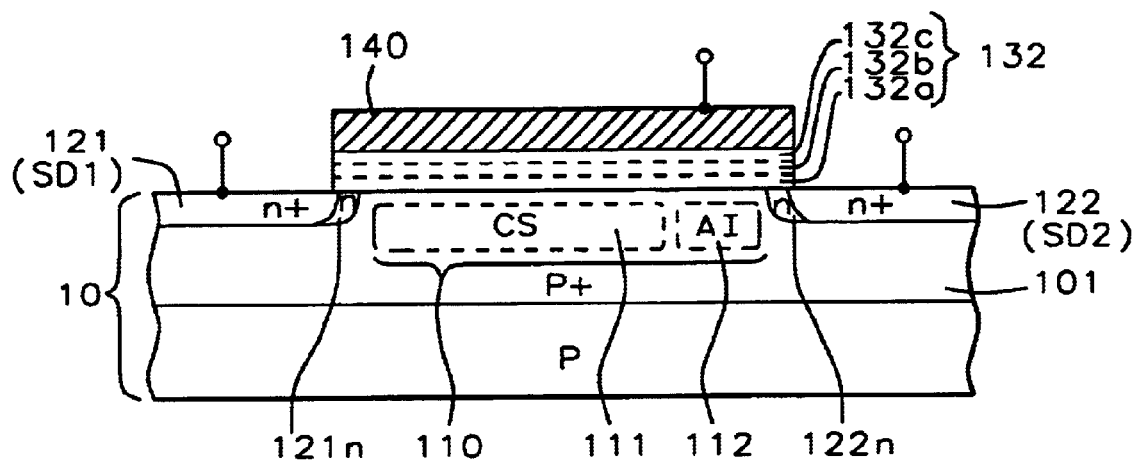
FIG. 1 shows a section of a nonvolatile memory cell in a first embodiment of the present invention.
Figure 2:
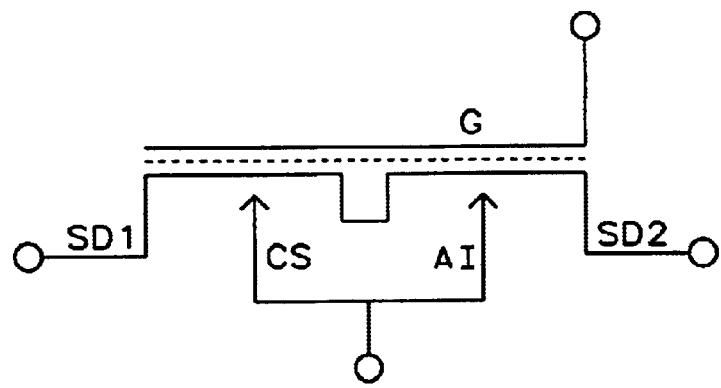
FIG. 2 shows an equivalent circuit of a nonvolatile memory cell in FIG. 1.
Figure 3:
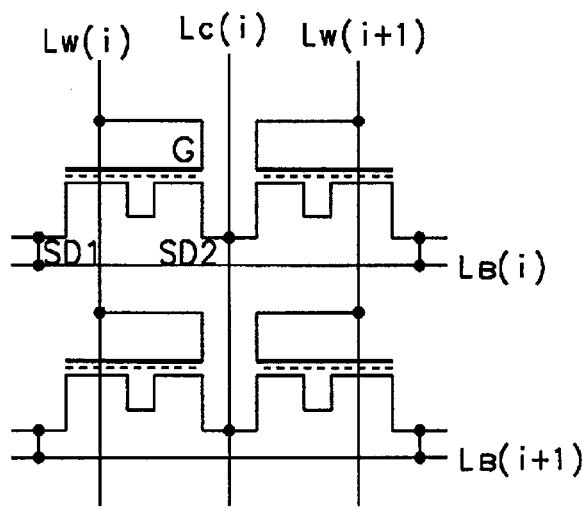
FIG. 3 shows a circuit configuration for a memory array in FIG. 1.

The detailed description of the present invention is now provided below in reference to the accompanying drawings. FIG. 1 shows a section of a nonvolatile memory cell in a first embodiment of the present invention and FIG. 2, an equivalent circuit thereto.

A p-well 101 is formed in a surface of a substrate 10 and a channel forming semiconductor region of one conductivity type 110 is defined in a surface of the p-well 101 and separated by a first $n^+$ region 121 (first impurity region of opposite conductivity type) (source/drain region: SD1) and a second $n^+$ region 122 (second impurity region of opposite conductivity type) (source/drain region: SD2). The channel forming semiconductor region 110 is a semiconductor region in a surface of which a channel is electrically induced and faded away and which comprises a surface of a semiconductor substrate itself or a well surface portion formed in a surface of a semiconductor substrate or a semiconductor thin film (SOI) formed on an insulating support substrate, etc. Thus, used as the substrate 10 are an SOI substrate and the like formed in a semiconductor substrate or main surface thereof.

A carrier-supplying portion (CS: carrier supply) 111 is formed coming into contact with the first $n^+$ region 121 and a carrier-acceleration-injection portion 112 (AI: acceleration and injection) is in contact with the second $n^+$ region 122 in said channel forming semiconductor region 110 wherein the carrier-supplying portion 111 and carrier-acceleration-injection portion 112 are in contact with each other.

The carrier-supplying portion 111 functions as a carrier path to supply a carrier supplied from the first $n^+$ region 121 to the channel forming semiconductor region 110 to the carrier-acceleration-injection portion 112 through channels therein or in a surface thereof.

As described in detail hereinafter below, the carrier-acceleration-injection portion 112 makes local injection of a carrier to which energy is supplied adjacent to the interface with the second $n^+$ region 122 in a very narrow region of a gate insulator 132.

The gate insulator 132 is formed to cover each opposite end surface of the first and second $n^+$ regions 121 and 122 and the channel forming semiconductor region 110, and a gate electrode 140 is formed on the gate insulator 132 to bridge each $n^+$ region 121 and $n^+$ region 122.

The gate insulator 132 is of a three-layer structure having a carrier trapping means. A first layer 132a on the channel forming semiconductor region 110 is preferably made from silicon oxide film (O) or silicon nitrided oxide film (ON), etc. forming a potential barrier at the interface with the channel forming semiconductor region 110.

A second layer 132b is preferably made from a silicon nitride film (N) or tantalum oxide film (T). It is also recommended that particulates of lower energy gap material such as TiN and the like, or of conductive material be buried in the silicon nitride film to improve the trapping probability of the injected carrier (electron). In addition, it is desirable that the film thickness of the silicon nitride film be less than 10 nm to enable programming with low voltage, but it is confirmed that carrier trapping is possible with even 4 nm. The silicon nitride film for the second layer 132b may contain a smaller quantity of oxygen in atomic percent compared to the silicon nitrided oxide film for the first layer 132a and third layer 132c (In this case as well as the case where particulates are buried in the silicon nitride films, a silicon nitride film for the second layer is designated as silicon nitride film (N) to differentiate the silicon nitride film for the second layer from that of the first and third layer in this embodiment.)

The third layer 132c beneath a gate electrode□ (140) is preferably made from a silicon oxide film (O) or silicon nitrided oxide film (ON) and the film thickness for both films is preferably more than 2 nm. A carrier charge is captured and trapped by a carrier trap level or trap site (carrier charge trapping function) formed within the second layer 132b or at the interface with the second layer 132b and third layer 132c.

It is possible to carry out the low voltage programming if the first layer 132a is comprised of a silicon oxide film with thickness of 3–4 nm or silicon nitrided oxide film and the third layer 132c comprises an oxide film with thickness of 2–4 nm or a silicon nitrided oxide film. Additionally, this makes the carrier tunnel probability of the third layer 132c higher than that of the first layer 132a and it is thus possible to make the electrical potential to be applied to the gate electrode 140 at the time of programming (programming electrical potential) and the electrical potential to be applied to the gate electrode 140 at the time of erasing (erasing electrical potential) to be the same polarity.

It is generally required to supply to a gate electrode electrical potential whose polarity is different depending on when programming and erasing are carried out. That is, if a carrier is assumed to be electron, a positive electrical potential is applied to the electrode 140 at the time of programming and a negative electrical potential is supplied to the electrode 140 at the time of erasing. However, additional circuit technology is required to generate the high electrical potential with different polarities in LSI which results in increasing the manufacturing cost. To this end, the present invention achieves carrier injection (programming) and extraction (erase) only by supplying to the gate electrode 140 the electrical potential with the same polarity and different level.

In the step as described above, if a silicon oxide film is used for the first layer 132a and a silicon nitrided oxide film is adopted for the third layer 132c, a potential barrier between the second layer 132b and third layer 132c viewed from the second layer 132b against the silicon nitrided oxide film is low and thus, the carrier tunnel probability across the third layer 132c becomes larger than the carrier tunnel probability across the first layer 132a even if the film thickness thereof is the same. It is also possible to make the thickness of the third layer 132c thinner than that of the first layer 132a if the silicon nitrided oxide film is used for each layer.

Combinations of material for a three-layer structure (first layer/second layer/third layer) can be designated such as O/N/O, ON/N/O, ON/N/ON, O/N/ON, O/T/O, ON/T/O, ON/T/ON AND O/T/ON.

If the length of the gate electrode 140 is 0.25–0.35 micro-meter, it is preferable that the impurity concentration of a carrier-supplying portion (p-type) be about 2E17 atm/cm$^3$, the impurity concentration of a carrier-acceleration-injection portion 112, about 1E18 atm/cm$^3$ and the length of the carrier-acceleration-injection portion be about 80 nm.

It is preferable that each n$^+$ region 121 and 122 is furnished with each n region 121n and 122n in contact with a channel forming semiconductor region 110 whose length is 50–70 nm and whose impurity concentration is 1-2E19 atm/cm$^3$ and the impurity concentration of the n$^+$ regions other than the n regions 121n and 122n, is about 1E21 atm/cm$^3$. The gate electrode 140 preferably comprises n-type polycrystal silicon or a two-layer structure of polysilicon and silicide (tungsten silicide, titanium silicide and cobalt silicide, etc.).

Next, a principle of operation disclosed in an embodiment of the present invention is now described below. When the predetermined acceleration-electrical potential (more than $V_B-2\phi_{F2}$, which is described below) is supplied to the n$^+$ region 122, the electrical potential difference more than the potential barrier $V_B$ to the gate insulator 132 is formed in a surface of the carrier-acceleration-injection portion and energy capable of getting over the electrical potential $V_B$ is supplied to carriers in part which pass the portion (space charge region). A carrier is generally transported to the direction of n$^+$ region 122 and the carrier which is scattered by lattice scattering to the direction of a carrier charge trapping means arrives at the carrier charge trapping means to be trapped getting over the potential barrier.

Meanwhile, in order to supply to many carriers energy more than the equivalent of the electrical potential $V_B$, it is required to form an electrical potential difference exceeding the electrical potential $V_B$ within the short length in the carrier-acceleration injection portion. However, this means that high electric field is required to be formed in a semiconductor. And, it is not possible to make shorter than about 30 nm the length to form the electrical potential difference corresponding to the potential barrier between silicon and a silicon oxide film, taking into account that the direct tunneling is started with the electric field of 1E6V/cm if silicon is used. Considering that a mean free path Lo for a high energy carrier is about 10 nm and said high electric field is formed on the portion corresponding to the length of 3Lo, out of the accelerated carriers, a carrier to be given the energy capable of getting over the potential barrier $V_B$ is obtained at the ratio of exp(-3Lo/Lo)=1/20. This is an adequately large value in view of the fact that the injection efficiency of a conventional channel hot electron is 1E-8.

If the probability (estimated to be in the order of $\frac{1}{100}$) of the direction change caused by lattice scattering is considered to be included in the value indicated above, it does not provide an advantage to the technology disclosed in the present invention compared to the conventional CHE technology unless the length covering a portion of the electrical potential difference is within 14Lo[exp(-14Lo/Lo)=1E-6]. The impurity concentration with which it is possible to generate an electrical potential difference corresponding to the electrical potential barrier $V_B$ is more than 2E17 atm/cm$^3$ with the length less than that indicated above.

Meanwhile, the impurity concentration with which it is possible to generate the electrical potential difference $V_B$ within a length of 3Lo is 3-4E 18 atm/cm$^3$. The length which a carrier is trapped to a charge trapping means is of the order of 10 nm to the direction of connecting two n$^+$ regions 121 and 122.

However, there is a small probability that the direction of a carrier to which energy is supplied is changed by lattice scattering and that such carrier is injected in the charge trapping means. As described in detail hereinafter below relating to other embodiments of the present invention, this enables higher speed writing if a surface step is disposed in a carrier moving direction in a carrier-acceleration-injection portion and the carrier which changes no direction is directly injected in a carrier trapping means of a gate insulator.

Next, a method of programming and erasing disclosed in an embodiment of the present invention is now described hereinafter below. Examples relating to a voltage supply at the time of programming are as follows.

(1) Supplied to the second n$^+$ region 122 is the voltage of more than $V_B-2\phi_{F2}\square V_B$: electrical potential barrier formed between the gate insulator 132 and channel forming semiconductor region 110, $\phi_{F2}$: a Fermi-level in a channel forming semiconductor region 110$\square$, e.g. 4.0V.

This acceleration-electrical potential supply extends a space charge region from the second n$^+$ region to the carrier-acceleration-injection portion 112. As a result, energy capable of getting over a potential barrier $V_B$ formed at the interface with the gate insulator 132 is supplied by an electrical potential difference in the space charge region to the carrier which is supplied from the carrier-supplying portion 111 to the carrier-acceleration injection-portion and which is moved to the adjacent interface with the second n$^+$ region 122.

(2) An electrical potential less than $(V_B-2\phi_{F2})$, e.g. 2.2V, is supplied to the first n+ region 121.

(3) An electrical potential which is higher than a gate threshold voltage, e.g. 3.3V, is supplied to the gate electrode 140.

As a result, it is possible to move the carrier to the second n+ region 122 when a space charge region (carrier path) is formed in a surface of the carrier-supplying portion 111 beneath the gate electrode 140 and the carrier is supplied from the first n+ region 121 to the carrier-supplying portion.

(4) A carrier is not injected into a carrier charge trapping means (in gate insulator 132) unless an electrical potential change is made to the first n+ region 121. If the electrical potential less than 1.8V is supplied to the first n+ region 121, the carrier is supplied from the first n+ region 121 to the carrier-supplying portion 111 and further moved to the carrier-acceleration-injection portion 112. Out of carriers moved to the carrier-acceleration-injection portion 112, a carrier moved to the adjacent interface with the second n+ region 122 without being affected by lattice scattering is provided with energy and locally injected in a very narrow region of the carrier charge trapping means by getting over the potential barrier.

In the step as described above, it is possible to store the multivalue information responsive to the supplied electrical potential if the electrical potential to be supplied to the first n+ region 121 is controlled in such a manner as to use a variety of voltages such as 0V, 0.6V and 1.2V and thus, the carrier supply quantity changes. The information, of course, may be stored in the form of a two-value using 0V.

The order of making an electrical potential in each region to return to the standby position (e.g. 0V) is conducted in the order of gate electrode 140, first n+ region 121 and second n+ region 122.

To erase the information (extraction of the trapped carrier), the trapped carrier is extracted to the gate electrode 140 by making each voltage for the first and second n+ regions 121 and 122 to be 0V and by supplying e.g. 9–10V to the gate electrode 140. The extraction of the excessive quantity of carrier may probably make the gate threshold voltage to be that of the depletion mode.

In the step as described above, there is a possibility that the leakage current is flowed from unselected memory cells to bit lines, if a memory array to be hereinafter described is comprised of a memory cell disclosed in the present invention. To resolve the problem as described above, it is required not to make higher the gate voltage for extracting a carrier or it is necessary to extract the trapped carrier until the detected threshold voltage reaches the predetermined value by repeating a step that the gate threshold voltage is detected and the carrier is then extracted.

When reading the stored information, e.g. 2.0V which is less than the electrical potential $(V_B-2\phi_{F2})$ is supplied to the first n+ region 121, e.g. 0V to the second n+ region 122 and e.g. 2.0V to the gate electrode to detect the current which is flowed in the first n+ region 121. In this step, it is judged to be "0" if, for example, such current as the leaked current is flowed therein and "1" (in the case of two-value storage), if the current more than a microampere unit is flowed therein.

It is possible to make carrier injection even if the impurity concentration in the carrier-acceleration-injection portion 112 is the same as that of the carrier-supplying portion 111 although the carrier injection efficiency is deteriorated. The carrier-acceleration injection portion 112 is defined as a space charge region to be formed in the channel forming semiconductor region 110 by supplying the electrical potential to the second n+ region 122.

Figure 35:
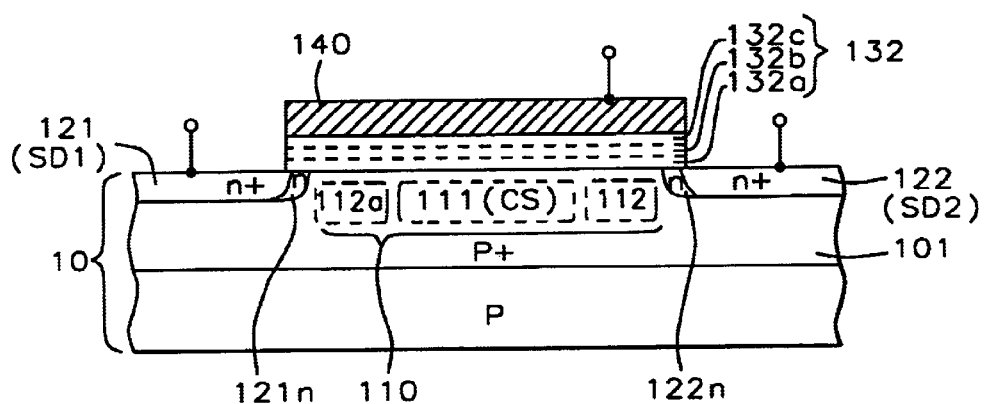
FIG. 35 shows a section of a nonvolatile memory cell in a second embodiment of the present invention.

According to a second embodiment of the present invention as shown in FIG. 35, it is possible to inject and trap a carrier charge in a gate insulator 132 on the channel forming semiconductor region of one conductivity type at a side of the first nt region (first impurity region of opposite conductivity type) 121 if a (first) carrier-acceleration-injection portion 112a is formed at a side of the first n+ region 121 and if the electrical potential supplying condition on the second n+ region (second impurity region of opposite conductivity type) 122 and first nt region 121 is made reversed. In the foregoing case, the carrier-supplying portion 111 is disposed in the channel forming semiconductor region 110 and sandwiched by the first carrier-acceleration-injection portion 112a and the (second) carrier-acceleration-injection portion 112. The first and second carrier-acceleration-injection portions 112a and 112 are generally comprised of the same impurity distribution.

According to an embodiment of the present invention, the high density integration is achievable since two storage sites can be made in one gate electrode 140.

However, when reading the carrier charge information trapped in a gate insulator on the first carrier-acceleration injection portion 112a, a space charge layer is made to extend from the second n+ region 122 to the channel forming semiconductor region 110 (part of the second carrier-acceleration injection portion 112) below a part of the gate insulator trapping the carrier charge supplied from the second carrier-acceleration injection portion 112.

If the condition as indicated above is satisfied, it is possible to read the information trapped in the gate insulator 132 on the first carrier-acceleration injection portion 112a without being substantially affected by the information trapped in the gate insulator on the second carrier-acceleration injection portion 112. For example, if electrical potential to be supplied to the second n+ region 122 is assumed to be 1.2V to "read" carrier charge, the impurity concentration in the second carrier-acceleration-injection portion 112 is required to be less than 2E18 atm/cm$^3$. To read the carrier charge trapped in the gate insulator on the second carrier-acceleration-injection portion 112, a control of electrical potential contrary to the foregoing is conducted.

Meanwhile, in order to form a memory array by integrating the aforesaid memory cell, a gate electrode 140(G) of each memory cell adjacent to the direction of a column is connected to a same word line Lw(i); a first n+ region 121(SD1) of each memory cell adjacent to the direction of a row is connected to a same bit line $L_B$(i) and a second n+ region 12(SD2) of each memory cell adjacent to the direction of a column is connected to a same common line $L_c$(i).

Programming, erasing and reading of information stored in the arrays as described above are possible by changing the cell operation for a selected cell from (1) a gate electrode 140 to a word line $L_W$(i), (2) a second n+ region 122 to a common line $L_C$(i), and (3) a first n+ region 121 to a bit line $L_B$(i).

In addition, it is possible to form a second array by connecting a gate electrode 140 to a word line $L_W$(i), a second n+ region 122 to a bit line $L_B$(i) and a first n+ region 121 to a common line $L_C$(i). Programming and erasing the second array are possible by changing the cell operation for the selected cell from (1) a gate electrode 140 to a word line $L_W$(i), (2) a first n+ region 121 to a common line $L_C$(i) and (3) a second n+ region 122 to a bit line $L_B$(i).

When reading the information stored in the array, electrical potential of the bit line $L_B$(i) is detected by supplying the electrical potential less than $(V_B-2\phi_{F2})$, e.g. 2V to the common line $L_C(i)$ and e.g. 3V to the word line $L_W(i)$. If a carrier is trapped in a carrier trapping means (in a gate insulator 132), the output electrical potential is so small as to be nearly zero. When the electron trapped in the carrier trapping means is small in quantity or zero, the output electrical potential becomes nearly 2V which is the same as that of the common line $L_C(i)$.

According to an embodiment disclosed in the present invention, it is possible to provide a nonvolatile memory cell which is not only of a single-gate one-transistor cell structure but also enables high efficiency injection and high density integration since local carrier injection is made from the channel forming semiconductor region 110 (carrier-acceleration injection portion) to the gate insulator 132.

Figure 4:
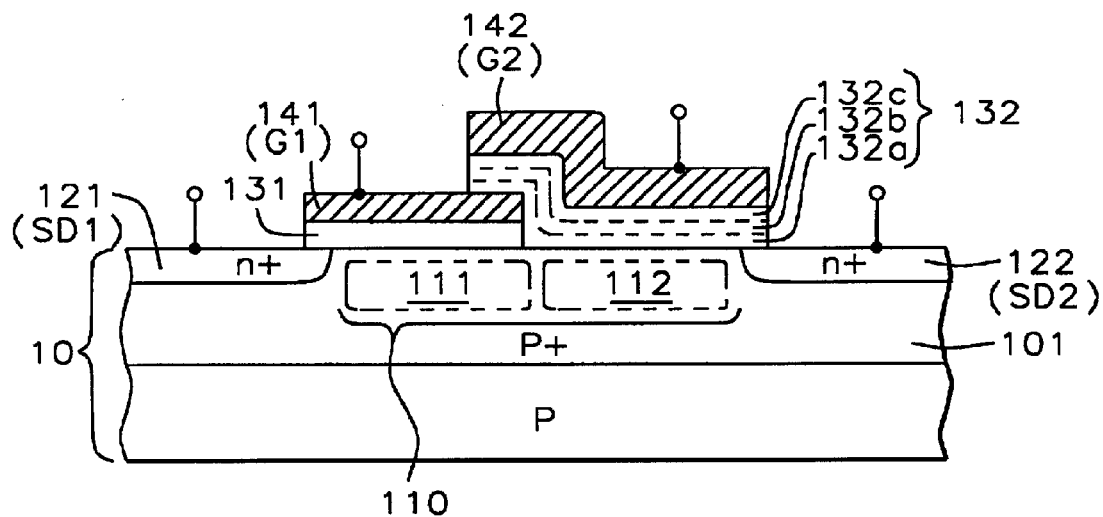
FIG. 4 shows a section of a nonvolatile memory cell in a third embodiment of the present invention.
Figure 5:
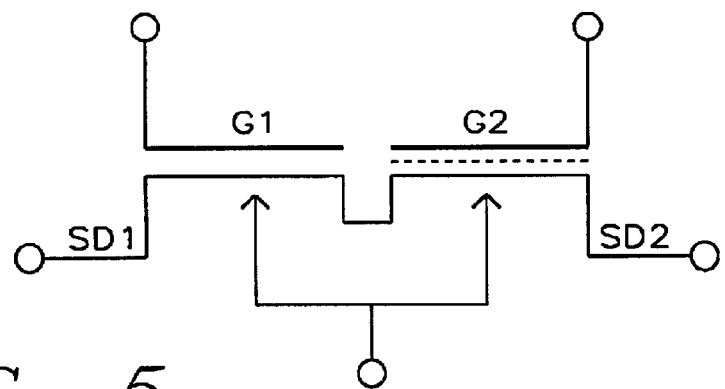
FIG. 5 shows an equivalent circuit of a nonvolatile memory cell in FIG. 4.

Next, described is a memory cell according to a third embodiment of the present invention in reference to FIG. 4 showing a section of a memory cell and FIG. 5 showing an equivalent circuit thereof.

The simple structure disclosed in the first and second embodiments has provided an advantage in terms of manufacturing technology. However, it is required to resolve a problem of a leakage current to be caused at the time of reading information which is associated with the aforesaid excessive erasing as far as the first and second embodiments are concerned. Furthermore, it is difficult to optimize the injection efficiency if the current to supply a carrier from the $n^+$ region 121 to the channel forming semiconductor region 110 at the time of programming is made small.

According to the third embodiment of the present invention, each gate electrode (and gate insulator) is independently formed over a carrier-supplying portion 111 and carrier-acceleration-injection portion 112 which resulted in not only making the read current to be less affected by leakage current from unselected cells due to the excessive erasing but also improving the injection efficiency at time of programming.

A well (101) is formed in a surface of a substrate (10) and a first $n^+$ region SD, (121) and second $n^+$ region $SD_2$(122) are formed at an interval in a surface of the well (101).

A carrier-supplying portion (111) adjacent to the first $n^+$ region (121) is formed in a channel forming region of one conductivity type between the first $n^+$ region (first impurity region of opposite conductivity type) (121) and second $n^+$ region (second impurity region of opposite conductivity type) (122), and a carrier-acceleration-injection portion (112) is formed adjacent to the second $n^+$ region (122).

A first gate electrode $G_1$ (141) is formed on a first gate insulator (131) on a surface of the carrier-supplying portion (111). A second gate electrode $G_2$ (142) is formed on a second gate insulator (132) with carrier charge trapping means on a surface of the carrier-acceleration injection portion (112). The second gate electrode (142) and gate insulation film (132) thereof are extended to cover part and end surface of the $n^+$ region (122) side of the first gate electrode (141), and the first gate electrode (141) and second gate electrode (142) are insulated by the second gate insulator (132).

As described above, an insulator to insulate the first gate electrode (141) and second gate electrode (142) may be separately formed as another (third) insulation film depending on a method of manufacturing thereof without being restricted by the extended gate insulator.

The second gate insulator (132) with the carrier charge trapping means is of a multilayer structure. Adopted in an embodiment of the present invention is a three-layer construction wherein a first layer (132a) (silicon oxide layer[O] or silicon nitrided ixide layer[ON]); a second layer (132b) (silicon nitride film layer[N], tantalum oxide film[T] or silicon oxy-nitride film [ON] whose oxygen to nitrogen ratio is smaller than that of the first and a third layer) and a third layer (132c)(silicon oxide film[O] or silicon nitrided oxide film [ON]) which forms a potential barrier at the interface with the second gate electrode (142) are laminated in that order.

With respect to the second layer of the second gate insulator (132), a carrier trapping level is formed at least at one location at the interface with the first layer (132a) or third layer (132c) or within the second layer itself and captured is a carrier injected from the carrier-acceleration-injection portion (112) to the second gate insulator (132).

Next, described below is a principle of the operation regarding the memory cell as described above. According to an embodiment of the present invention, a carrier is first injected from the first $n^+$ region (121) to the carrier-supplying portion (111). Further, the carrier is injected from the carrier-acceleration injection portion (112) to the second gate insulator (132) overcoming the potential barrier therebetween. To inject a carrier from the first $n^+$ region (121) to the channel forming region (110), either of two conditions A and B below is required to be satisfied.

Condition A

A potential which is higher than the first gate threshold voltage ($V_{th1}$) in reference to the first $n^+$ region (121) is applied to the first gate electrode (141), or a constant predetermined potential is applied to the first electrode (141) and in a surface of the channel forming region under the first gate electrode (141), a channel is induced by a potential of the first $n^+$ region (121) which is lower than the value obtained by having the first gate electrode threshold voltage ($V_{th1}$) subtracted from the predetermined potential.

Condition B

The first $n^+$ region (121) is forward-biased to a channel forming region and minority carriers are injected in the channel forming region (MC injection).

Furthermore, two conditions C and D below are required to be satisfied simultaneously in order to inject the carrier injected in the carrier-acceleration-injection portion (112) via the carrier-supplying portion (111) into the second gate insulator (132) getting over a potential barrier ($V_B$) between the carrier-acceleration-injection portion (112) and second gate insulator (132) corresponding to the first layer (132a).

Condition C

Supplied to the second $n^+$ region (122) is electrical potential for acceleration more than ($V_B-2\phi_{F2}$) based on the channel forming semiconductor region.

Condition D

Supplied to the second gate electrode 142 is electrical potential for attracting a carrier more than ($V_B-\phi_{GB}$) [$\phi_{GB}$: a work function difference between a gate material and channel forming semiconductor region] with reference to the channel forming semiconductor region 110.

The electrical potential for attracting a carrier can be established independently of the electrical potential in the aforesaid first gate electrode and thus, it is possible to achieve high efficient carrier injection into a carrier storage means by making larger the electrical potential supplied to the second gate electrode 142 and making the electrical potential of the first gate electrode to be as small as the gate threshold voltage for keeping a channel current to be small.

Based on the conditions as described above, a carrier is supplied from the first $n^+$ region 121 to the carrier-supplying portion 111. Further, out of carriers moved to the carrier-acceleration-injection portion, supplied to a carrier which is moved to the adjacent interface with the second n$^+$ region 122 and which is not affected by lattice scattering is energy capable of getting over a potential barrier $V_B$ by means of interaction between the electrical potential for attracting a carrier supplied to the second gate electrode 142 and the energy generated by the acceleration-electrical potential supplied to the second n region 122. As a result, the carrier is locally injected from part (the adjacent interface with the second n$^+$ region 122) of the carrier-acceleration-injection portion 112 into the second gate insulator 132 getting over the potential barrier $V_B$ and locally stored viewed from a plane in the second gate insulator 132, further injection is conducted around the portion in which the carrier is already trapped.

Next, a carrier erase (extraction) mechanism in the memory cell is described below. Since the three-layer structure is adopted in the second gate insulator (132) according to an embodiment of the present invention, two types of erase mechanisms below can be selectively used.

(a) First Erase Mechanism

A potential whose polarity is the same as that of the carrier charge is fed to the second gate electrode (142) and the carrier which is injected and captured in the second gate insulator (132) is returned via tunnel to the channel forming region through the first layer (132a) (The average electric field required for this step is about 8 MV/cm). To adopt this erase mechanism, a carrier tunnel probability of the first layer (132a) is preferably predetermined to be higher than that of the third layer (132c).

More particularly, the thickness of the first layer (132a) is made thinner than that of the third layer (132c) if the material of each potential barrier layer (132a) and (132c) is the same. Adopted is such material combination that the barrier height between the first and second layer viewed from the second layer (132b) to the carrier may be lower than that between the second and third layers if each thickness thereof is the same.

(b) Second Erase Mechanism

A potential whose polarity is different from that of the carrier charge is fed to the second gate electrode (142) and the carrier which is injected and captured in the second gate insulator (132) is extracted by tunnel-transferring the third layer (132c). To adopt this erase mechanism, a carrier tunnel probability of the third layer (132c) is preferably predetermined to be higher than that of the first layer (132a).

More particularly, the thickness of the third layer (132c) is made thinner than that of the first layer (132a) if the material of each potential barrier layer is the same. Adopted is such material combination that the barrier height between the second and third layers viewed from the second layer (132b) to the carrier may be lower than that between the first and second layers if each thickness thereof is the same.

In order to adopt the first erase mechanism, it is required to supply to the second gate electrode (142) the potential whose polarity changes depending on the programming and erasing operation.

Meanwhile, according to an embodiment of the present invention, both carrier injection and extraction are possible only by supplying to the second gate electrode (142) the potential with the same polarity and different levels if the second erase mechanism is specifically adopted.

According to an embodiment of the present invention, the second gate insulator (132) is of a three-layer structure and the third layer (132c) as a potential barrier layer is disposed at the interface with the second gate electrode (142). This makes thinner the second layer (132b) while keeping the carrier charge trapping function and enables the carrier extraction to the gate side by the tunnel transition through the third layer (132c). However, if the potential to extract the carrier to the gate side is applied to the second gate electrode (142), the electric field caused by this potential is also effective to a carrier within the channel forming region.

In a conventional memory structure wherein the carrier injection from the channel forming region to the second gate insulator (132) is conducted by a tunnel transition, the probability of a carrier tunnel within an insulator (corresponding to the first layer 132a in an embodiment of the present invention) formed on a surface of a channel forming region is predetermined to be high. This causes the simultaneous tunnel injection from the channel forming region to the second gate insulator (132) and makes it substantially impossible to extract the carrier from the second gate insulator (132).

Meanwhile, it is possible to make adequately low the probability of the carrier tunnel across the first layer (132a) (channel forming region side) since the carrier injection from the channel forming region to the second gate insulator (132) is conducted not by tunnel transfer but by overcoming the potential barrier according to an embodiment of the present invention. Thus, it is possible to extract a number of injected carriers through the third layer (132c) by reducing the tunnel injection volume to the second gate insulator to be negligibly small even if the second gate electrode (142) is made to be in the high potential.

In the case the second erase mechanism is adopted, a silicon oxide film (O) and silicon nitrided oxide film (ON), etc. are preferably used for the first layer (132a) and the thickness of each film is desired to be more than 3 nm. Further, a silicon nitride film (N) and tantalum oxide film (T) are preferably used for the second layer (132b) and the silicon nitride film thickness is desirably less than 10 nm for the low voltage programming. However, it is confirmed that the programming is possible even with 4 nm thick film.

The silicon nitride film of the second layer (132b) may include a smaller volume of oxygen in atomic percent than that in the silicon nitrided oxide film used in the first and third layers. The thickness of the tantalum oxide is preferably less than 50 nm. It is recommended that the silicon oxide film (O) or the silicon nitrided oxide film (ON) be used for the third layer and the film thickness thereof be more than 2 nm.

That is, combinations among the first, second and third layers of the second gate insulator can be designated such as O/N/O, ON/N/O, ON/N/ON, O/N/ON, O/T/O, ON/T/O, ON/T/ON AND O/T/ON.

It is possible to provide a memory cell which is programmable and erasable with low voltage and same polarity if the memory cell is so structured that the first layer (132a) is comprised of a silicon oxide film or a silicon nitrided oxide film with the film thickness of 3–4 nm and the third layer, a silicon oxide film or a silicon nitrided oxide film with the film thickness of 2–4 nm.

However, if a silicon oxide film is used for the first layer and a silicon nitrided oxide film is adopted for the third layer, the film thickness of both layers may be the same. The reason for this is that a potential barrier between the second layer and the first layer viewed from the second layer against the silicon nitrided oxide film is low and the carrier tunnel probability to the third layer becomes larger than a potential barrier between the second layer and the first layer even if the film thickness is the same. Also, it is possible to make the thickness of the third layer thinner than that of the first layer if the silicon nitrided oxide film is used for each layer.

If the acceleration-electrical potential more than $(V_B-2\phi_{F2})$ as specified in condition C is supplied to the second n$^+$ region 122 and a space charge region is extended from the second n region 122 to the carrier-acceleration-injection portion 112, energy generated by an electrical potential difference in this extended portion is supplied to a carrier in the carrier-acceleration-injection portion. The shorter the length of the extended portion to which the energy is supplied, the larger quantity of carriers obtain energy to get over the potential barrier $V_B$. Thus, the impurity concentration of the carrier-acceleration-injection portion is preferably made higher which is determined to be as high as 2E17-4E18 atm/cm$^3$ according to an embodiment of the present invention.

□□ If the impurity concentration of the carrier-acceleration-injection portion (112) is made to be higher than that of the carrier-supplying portion (111), a punch-through voltage from the second n$^+$ region (greater reverse bias is fed to the second n$^+$ region than to the first n$^+$ region.) becomes smaller than that from the first n$^+$ region if voltage is applied between the first and the second n$^+$ regions (121, 122).

Figure 6:
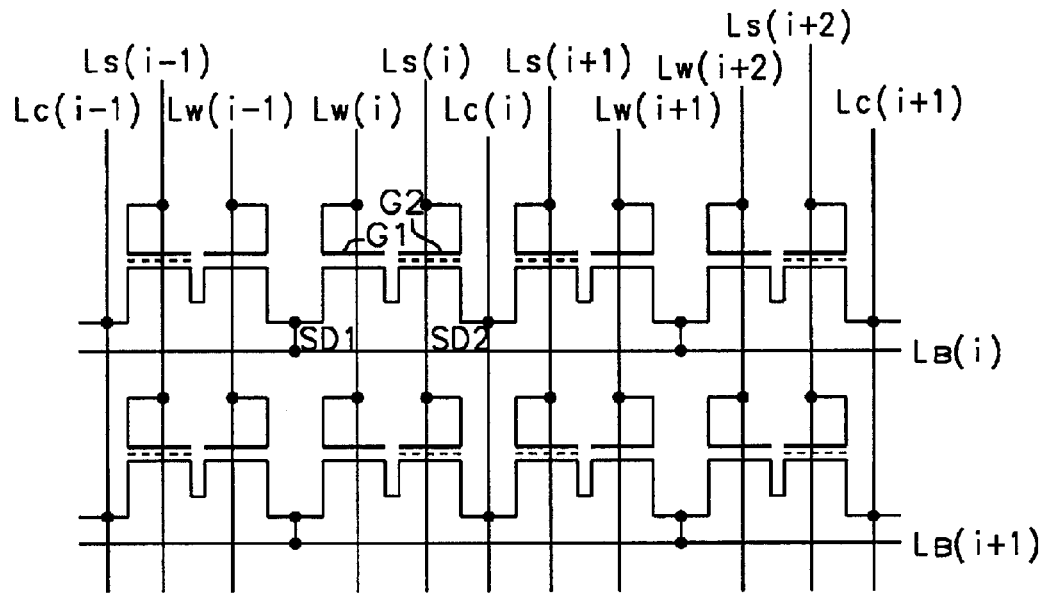
FIG. 6 shows a circuit configuration (First embodiment) for a memory array in FIG. 4.

Next, provided below is the description regarding a nonvolatile memory array so configured that the nonvolatile memory cell as described above is aligned in the form of a matrix. FIG. 6 shows an example of a connection configuration of a first nonvolatile memory array.

A first n$^+$ region SD$_1$ (121) of each memory cell on a same row is connected by a bit line (L$_B$). A second n$^+$ region SD$_2$ (122) of memory cells adjacent to the direction of a row is commonly connected and connected to the direction of a column by a common line (L$_C$) A first gate electrode G$_1$ (141) of each memory cell on a same column is connected by a word line (L$_W$). A second gate electrode G$_2$ (142) of each memory cell on a same column is connected by a control line (L$_S$).

Figure 7:
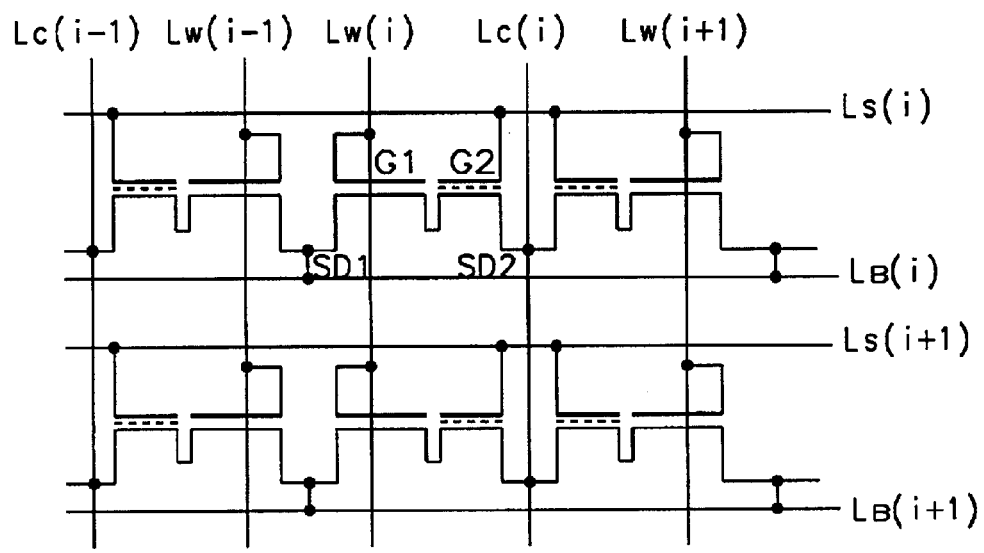
FIG. 7 shows a circuit configuration (Second embodiment) for a memory array in FIG. 4.

FIG. 7 shows a connection configuration of a second nonvolatile memory array. A first n$^+$ region SD$_1$ (121) of each cell on a same row is connected by the bit line (L$_B$). Each second n$^+$ region SD$_2$ (122) of the memory cells adjacent to the direction of a row is connected and also connected by a common line (L$_C$) in the direction of a column. A first gate electrode G$_1$ (141) of each memory cell on a same row is connected by a word line (L$_W$). A second gate electrode G$_2$ (142) of each memory cell on a same row is connected by a control line (L$_S$).

FIG. 8 is a signal waveform illustration showing a method of programming and reading a memory array in the first and second circuit configurations.

When programming (writing of information) the selected memory cell, a channel is induced in the surface of a carrier-supplying portion 111 depending on the electrical potential of a bit line L$_B$ by applying to a word line L$_W$ an electrical potential $V_{wp1}$ which is higher than a gate threshold voltage $V_{th1}$ of the first gate electrode 141. According to the condition C, the electrical potential which is higher than the value $(V_B-2\phi_{F2})$ is applied to a selected common line L$_c$(n$^+$ region 122) and applied to an unselected common line L$_c$ is an adequate electrical potential including zero volt in the direction of the reverse bias which is lower than junction breakdown voltage, e.g. 0V. According to the condition D, the electrical potential for attracting a carrier which is higher than $(V_B-2\phi_{GB})$ is applied to the selected control line L$_s$ (second gate electrode 142) and applied to an unselected control line L$_s$ is such predetermined electrical potential, e.g. 0V that the programming may not be caused by tunnel current.

Applied in advance to a bit line (L$_B$) is a predetermined potential ($V_{BPr}$) which is higher than the value ($V_{WPr1}-V_{th1}$) obtained by subtracting the threshold voltage ($V_{th1}$) from the potential ($V_{WPr1}$) to be fed to the word line (L$_W$). When programming a memory array, the potential ($V_{BPr1}$) which is higher than the difference value ($V_{WPr1}-V_{th1}$) or the potential ($V_{BRr0}$) which is lower than the difference value ($V_{WPr1}-V_{th1}$) is applied thereto depending on the content of the data stored. In this step, it is possible to program information in the form of a multivalue if the applied potential ($V_{BPr0}$) to the bit line (L$_B$) is selected out of multi value as shown with broken lines.

Based on the program operation as described above, a carrier injected from the first n$^+$ region (121) to the carrier-supplying portion (111) is locally injected in the second layer (132$b$) by getting over the potential barrier between the carrier-acceleration-injection portion (112) and second gate insulator 132 (first layer 132$a$) and thus, the information responsive to the potential applied to the bit line (L$_B$) is stored in the form of nonvolatility.

When reading the data stored in the selected memory cell, the reverse bias electrical potential $V_{BRD}$ is applied to the bit line L$_B$ of the memory cell and applied to the control line L$_s$ is the electrical potential $V_{CRD}$ which is higher than the lower value out of the programmed gate threshold voltage $V_{th2}$ of the second gate electrode 142 and also, applied to the word line L$_W$ is the electrical potential $V_{WRD}$ which is higher than the gate threshold voltage $V_{th1}$ of the first gate electrode 141. In the state as described above, whether a memory cell is on or off, i.e. the data are stored in the memory cell is judged by detecting the current ($i_{WRD}$) flowing in the bit line (L$_B$) by a sensing amplifier. The data judgment as described above may be made not by directly detecting the current but by the discharge speed (potential change) of an electric charge which has charged the bit line.

However, the methods for configuring and programming a memory cell are not limited to those described above, but may be modified as follows.

Figure 9:
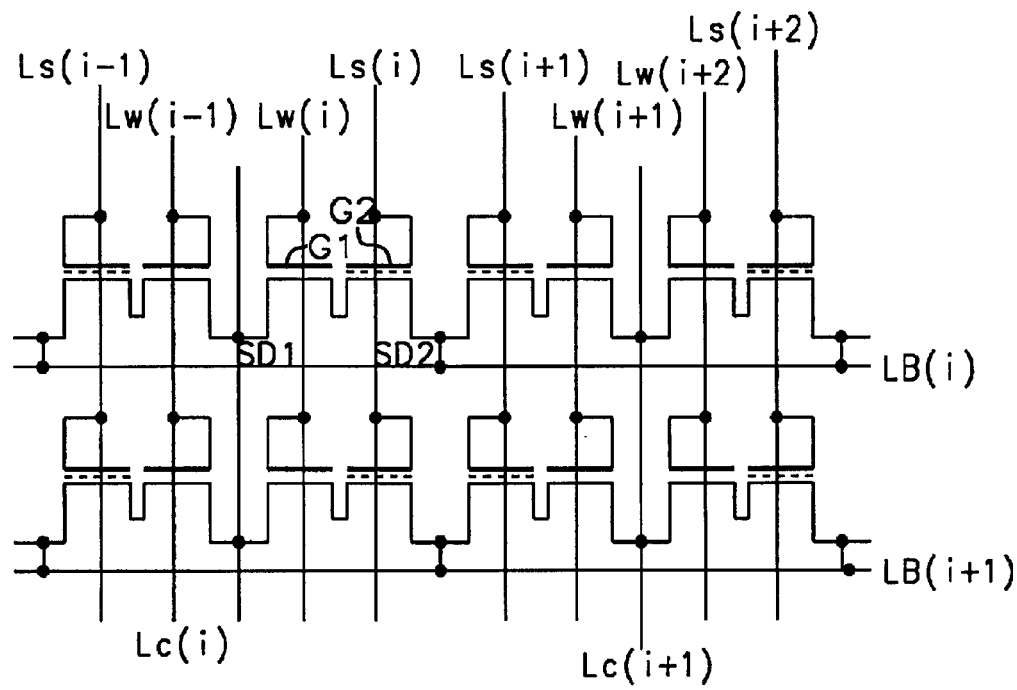
FIG. 9 shows a circuit configuration (Third embodiment) for a memory array in FIG. 4.

FIG. 9 is an illustration showing a third modified example of the connection configuration. A first n$^+$ region SD$_1$ (121) of memory cells adjacent to the direction of a row is commonly connected and is connected by a common line (L$_c$) to the direction of a column. A second n$^+$ region SD$_2$ (122) of each memory cell in a row direction is connected by a bit line (L$_B$). A first gate electrode G$_1$ (141) of each memory cell in a column direction is connected by a word line (L$_W$). A second gate electrode G$_2$ (142) of each memory cell in a column direction is connected by a control line (L$_S$).

Figure 10:
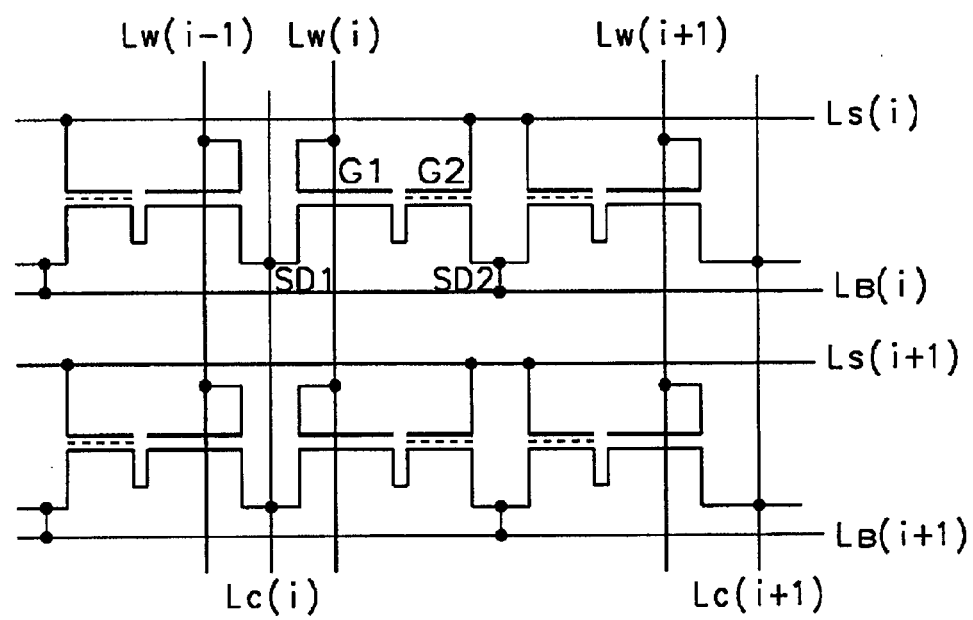
FIG. 10 shows a circuit configuration (Fourth embodiment) for a memory array in FIG. 4.

FIG. 10 is an illustration showing a fourth modified example of a connection configuration. A first n$^+$ region SD$_1$ (121) of each memory cells adjacent to the direction of a row is commonly connected and connected by a common line (L$_c$) to the direction of column. A second n$^+$ region SD$_2$ (122) of each memory cell in a row direction is connected by a bit line (L$_B$). A first gate electrode (141) of each memory cell in a column direction is connected by a word line (L$_W$). A second gate electrode (142) of each memory cell in a column direction is connected by a control line (L$_S$).

Figure 11:
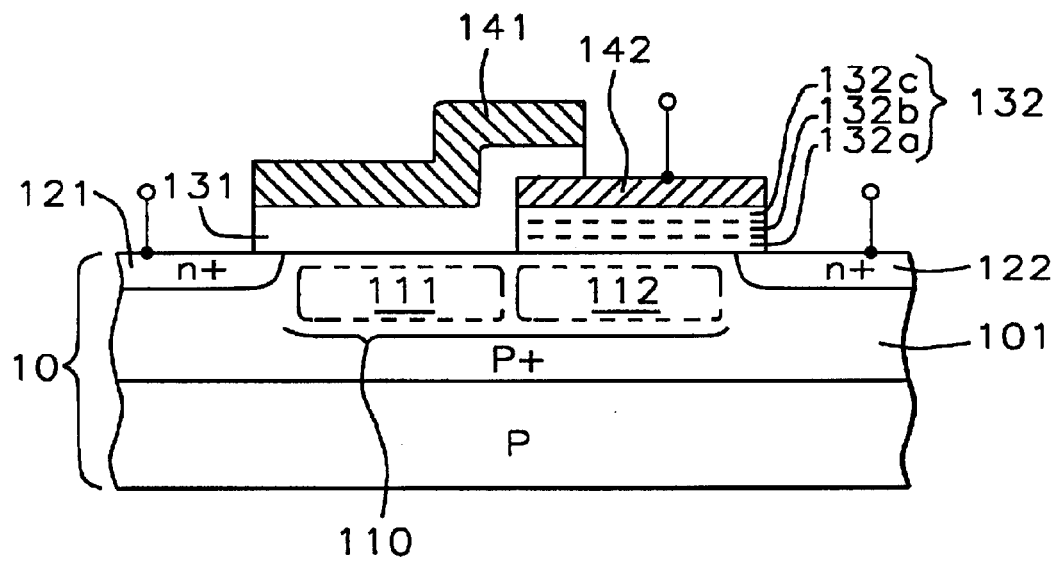
FIG. 11 shows a section of a nonvolatile memory cell in a fourth embodiment of the present invention.

FIG. 11 shows a section of a nonvolatile memory cell in a fourth embodiment of the present invention. The same symbols as those used in the previous description represent the same or corresponding portions therein.

According to the fourth embodiment of the present invention, contrary to the structure in a third embodiment of the present invention is the structure that a first gate electrode (141) and gate insulator (131) thereof are superimposed with a second gate electrode and gate insulator (132) thereof at each end portion wherein the first gate electrode (141) and gate insulator (131) thereof are extended to cover a surface and end surface at the first n+ region (121) side of the second gate electrode (142).

Figure 12:
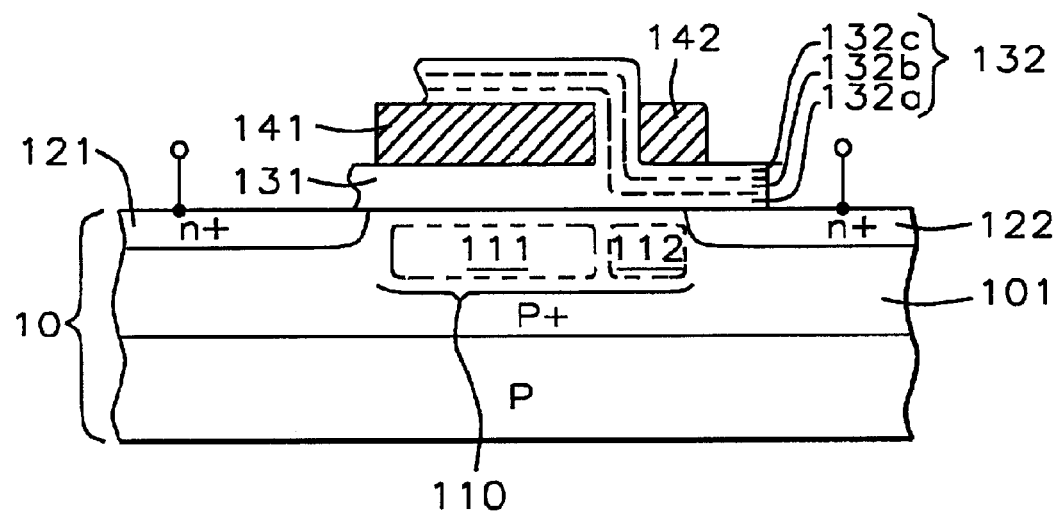
FIG. 12 shows a section of a nonvolatile memory cell in a fifth embodiment of the present invention.

FIG. 12 shows a section of a nonvolatile memory cell in a fifth embodiment of the present invention. The same symbols as those used in the previous description represent the same or corresponding portions therein.

According to the fifth embodiment of the present invention, first and second electrodes (141) and (142) are disposed by having a second gate insulator (132) formed therebetween and are reciprocally insulated by the second insulator (132).

In the first to the fourth embodiments of the present invention, provided previously was the description that the first and second electrodes (141) and (142) are insulated with a first insulator (131) or a second (132), but the insulation may be made with other (third) insulator. Or achieved may be multiple insulation in such a manner that the first gate insulator (131) or the second (132) is used, or the second (132) in combination with other insulation films.

Figure 13:
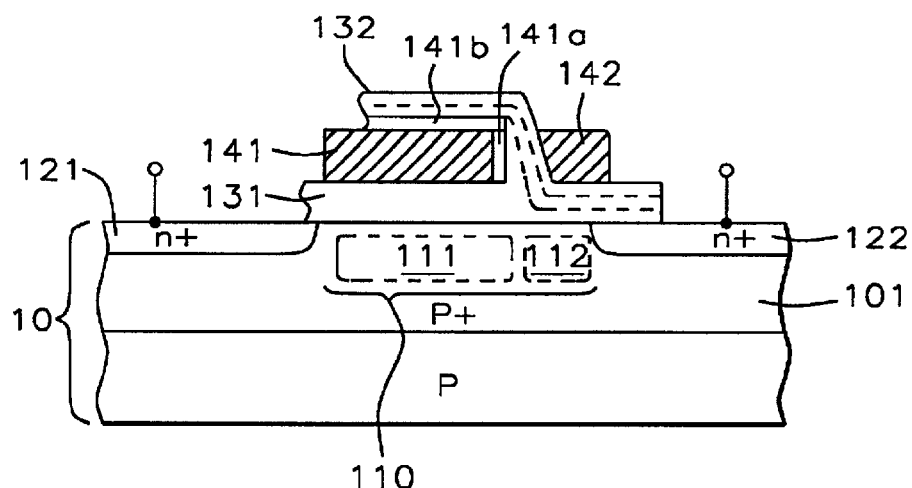
FIG. 13 shows a section of a nonvolatile memory cell in a sixth embodiment of the present invention.

As shown in FIG. 13 as a sixth embodiment of the present invention, in order to reduce the coupling capacitance between the first gate electrode (141) and second gate electrode (142) and improve a drive speed, a nitride film (141b) may be formed in advance on an upper surface of the gate electrode (141) or an end surface of the gate electrode (141) can be oxidized to form an oxide film (141a) or a surface of a side-wall (not shown in accompanying drawings) as an insulating material may be formed at a side surface of the gate electrode (141) in place of an oxide film (141b). It is possible to form the side-wall by uniformly forming an insulating layer on, e.g. a main surface of the substrate (10) and selectively removing the insulator therefrom via an anisotropic etching method thereof.

Figure 14:
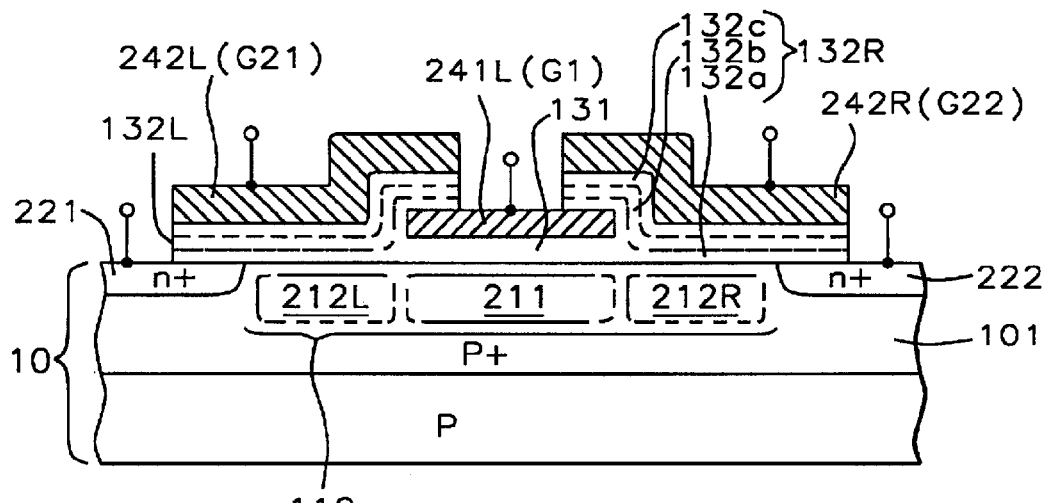
FIG. 14 shows a section of a nonvolatile memory cell in a seventh embodiment of the present invention.
Figure 15:
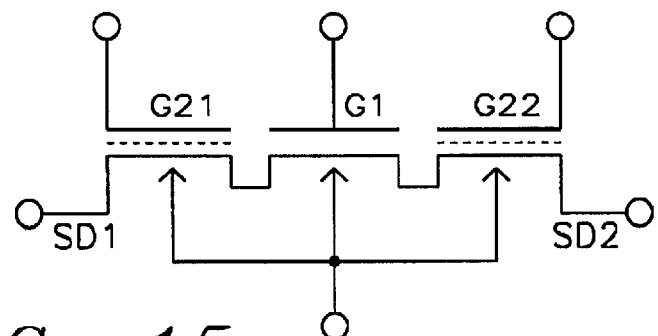
FIG. 15 shows an equivalent circuit of a nonvolatile memory cell in FIG. 14.

FIG. 14 shows a section of a nonvolatile memory cell in a seventh embodiment of the present invention and FIG. 15, an equivalent circuit to a nonvolatile memory cell in FIG. 14. The same symbols as those used in the previous description represent the same or corresponding portions therein. A nonvolatile memory cell in a fourth embodiment of the present invention is featured in that the data corresponding to two bits can be independently stored in a memory cell.

A well (101) is formed in a surface of the substrate (10) and a pair of n regions $SD_1$ (221) and $SD_2$ (222) are formed at an interval in a surface of the well (101). In a channel forming semiconductor region of one conductivity type (110) between each n regions (first impurity region and second impurity region of opposite conductivity type) (221) and (222), are formed a carrier-supplying portion (211), and first and second carrier-acceleration-injection portions (212L) and (212R) along the channel direction. Each of the carrier-acceleration-injection portions (212L) and (212R) is disposed adjacent to each n+ regions (221) and (222). The carrier-supplying portion (211) is disposed between the carrier-acceleration-injection portions (212L) and (212R).

A first gate electrode $G_1$ (241) is formed on a first gate insulator (131) on a surface of the carrier-supplying portion (211). A first one of a second gate electrode $G_{21}$ (242L) is formed on a first one of a second gate insulator (132L) with charge storing means on a surface of the first carrier-acceleration injection portion (212L). The first one of the second gate electrode (242L) and gate insulator (132L) thereof are extended to cover part and end surface of the first gate electrode (241) of the n+ region (221) side, and the first gate electrode (241) and the first one of the second gate electrode (242L) are insulated by the first one of the second gate insulator (132L).

Likewise, a second one of a second gate electrode $G_{22}$ (242R) is formed on a second one of a second gate insulator (132R) with charge storing means on a surface of the second carrier-acceleration-injection portion (212R). The second one of the second gate electrode (242R) and gate insulator (132R) are extended to cover part and end surface of the first gate electrode (241), and the first gate electrode (241) and second one of the second gate electrode (242R) are reciprocally insulated by the second one of the second gate insulator (132R).

According to the embodiment of the present invention, each of the second gate insulators (132L) and (132R) is of a multilayer structure to achieve a low voltage programming and as described in each embodiment of the present invention, a first layer 132a (silicon oxide layer[O] or silicon nitrided oxide layer[ON]) forming a potential barrier at the interface with the channel forming region; a second layer 132b (silicon nitride film layer[N], tantalum oxide film[T] or silicon oxy-nitride film [ON]whose oxygen to nitrogen ratio is smaller than that of the first layer and third layer) and a third layer 132c (silicon oxide film[O] or silicon nitrided oxide film [ON]) which forms potential barrier at the interface with the second gate electrode (142) are laminated in their order.

However, if the low voltage drive as described above is not required, each of the second gate insulators (132L) and (132R) is adequate to have charge storing means, e.g. the film may be of a two-layer structure.

In the construction as described above, when injecting a carrier into the first one of the second gate insulator 132L, acceleration-electrical potential is supplied to the first n+ region 221 and electrical potential for attracting a carrier is supplied to the first one of the second gate electrode 242L. Meanwhile, an electrical potential difference which is larger than the programmed gate threshold voltage is supplied between the first one of the second gate electrode 242R and the n+ region 222 and the electrical potential difference which is larger than the gate threshold voltage is supplied between the first gate electrode 241 and the n+ region 222.

Thus, the second carrier-acceleration-injection portion 212R functions as a carrier path to supply a carrier from the n+ region 222 to the carrier-supplying portion 211 and the carrier is further supplied to the first carrier-acceleration-injection portion 212L via the carrier-supplying portion 211. Out of carriers supplied to the first carrier-acceleration-injection portion 212L, a carrier moved to the adjacent interface with the n+ region 221 without being affected by lattice non-elastic scattering is provided with energy generated by acceleration-electrical potential supplied to the n+ region 221 and attracted by the electrical potential for attracting a carrier supplied to the first one of the second gate electrode 242L, being locally injected in a very narrow region of a carrier charge trapping means (a gate insulator) getting over the potential barrier.

When injecting a carrier into the second one of the second gate insulator, acceleration-electrical potential is supplied to the n+ region 222 and electrical potential for attracting a carrier is fed to the second one of the second gate electrode. Meanwhile, the electrical potential difference which is larger than the programmed gate electrode threshold voltage is supplied between the first one of the second gate electrode and the $n^+$ region 221 and an electrical potential difference which is larger than the gate threshold voltage is supplied between the first gate electrode 241 and $n^+$ region 221.

Thus, the first carrier-acceleration-injection portion 212R functions as a carrier path to supply a carrier from the $n^+$ region 221 to the carrier-supplying portion 211 and the carrier is further supplied to the second carrier-acceleration-injection portion 212R via the carrier-supplying portion 211. Out of carriers supplied to the second carrier-acceleration-injection portion 212R, a carrier transported to the adjacent interface with the $n^+$ region 222 without being affected by non-elastic lattice scattering is provided with energy generated by the acceleration-electrical potential supplied to $n^+$ region 222 and attracted by the electrical potential for attracting a carrier supplied to the second one of the second gate electrode 242R, being locally injected in a very narrow region of the carrier charge trapping means getting over the potential barrier.

According to the above embodiment of the present invention, it is possible to independently memorize the data stored in each of the second gate insulators (132L) and (132R) and thus, to store two-bit data in one cell which results in providing a high integration density memory.

However, it is possible to program a memory cell with low voltage if each of the second gate insulators (132L) and (132R) is of a three-layer structure and a carrier injection from a channel forming region to a gate insulator is performed by getting over the potential barrier, according to the fourth embodiment of the present invention.

Furthermore, if the carrier is extracted to a gate electrode by controlling each carrier tunnel probability of a first layer and a third layer of the second gate insulators (132L) and (132R) in the same manner as described above, both carrier injection and extraction are achievable by feeding to the gate electrode the potential whose polarity is the same and whose level is different.

Figure 16:
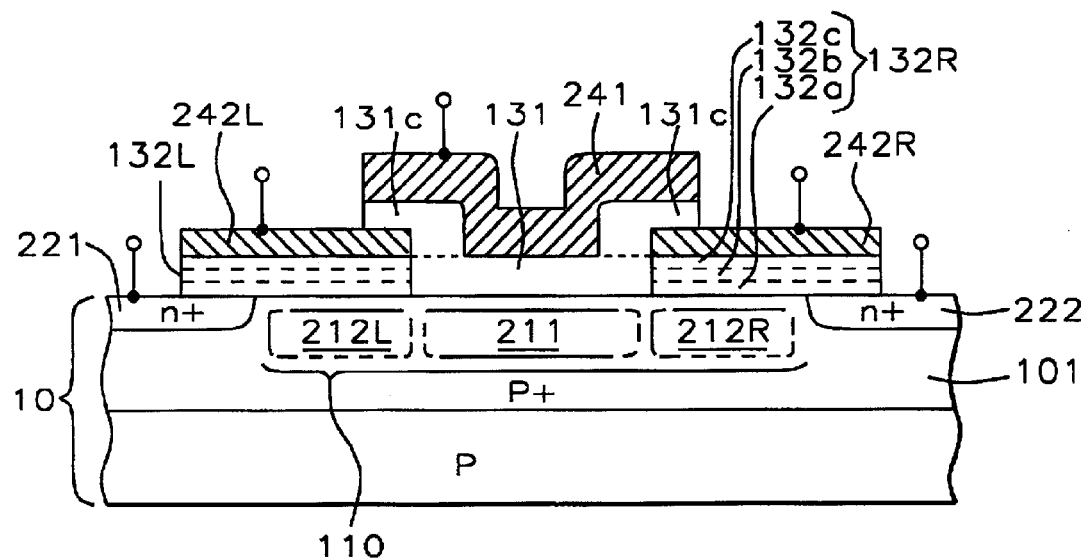
FIG. 16 shows a section of a nonvolatile memory cell in a eighth embodiment of the present invention.

FIG. 16 shows a section of a nonvolatile memory cell in a eighth embodiment of the present invention. The same symbols as those used in the previous description represent the same or corresponding portions therein.

The structure of a memory cell disclosed in the seventh and the eighth embodiment of the present invention is different with respect to a relation between the upper and lower portions of an electrode wherein both ends of the first gate electrode 241(and a gate insulator or other insulator 131c) are formed to cover the end portion and end surface of each of the first one and second one of the second gate electrodes (242L) and (242R).

The same advantage as that in the seventh embodiment of the present invention is achieved in this eighth embodiment thereof. Furthermore, provided is a structure suitable for interconnecting the first gate electrode (241) across the $n^+$ regions (221) and (222) according to the eighth embodiment.

Figure 17:
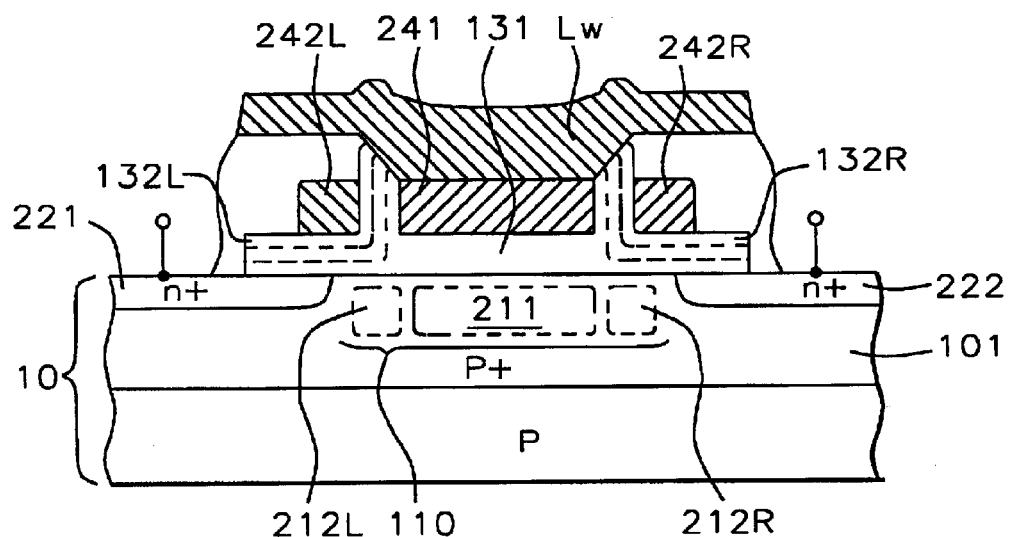
FIG. 17 shows a section of a nonvolatile memory cell in a ninth embodiment of the present invention.

FIG. 17 shows a section of a nonvolatile memory cell in a ninth embodiment of the present invention. The same symbols as those used in the previous description represent the same or corresponding portions therein.

According to the ninth embodiment, a first gate electrode (241) is formed on the first gate insulator (131) on a surface of the carrier-supplying portion (211). Each of the second gate insulators (132L) and (132R) is formed between each of the carrier-acceleration injection portions (212L) and (212R) and each of the second gate electrodes (242L) and (242R), and further, extended to a gap between the first gate electrode (241) and each of the second gate electrodes (242L) and (242R).

Each one of the second gate electrodes (242L) and (242R) is formed as a pair of side-walls on the second gate insulator (132) on a surface of each of the carrier-acceleration injection portions (21L) and (212R). A word line ($L_W$) is connected to an upper portion of the first gate electrode (241). The same advantage as that in the seventh and eighth embodiments of the present invention is achieved in this ninth embodiment.

Figure 18:
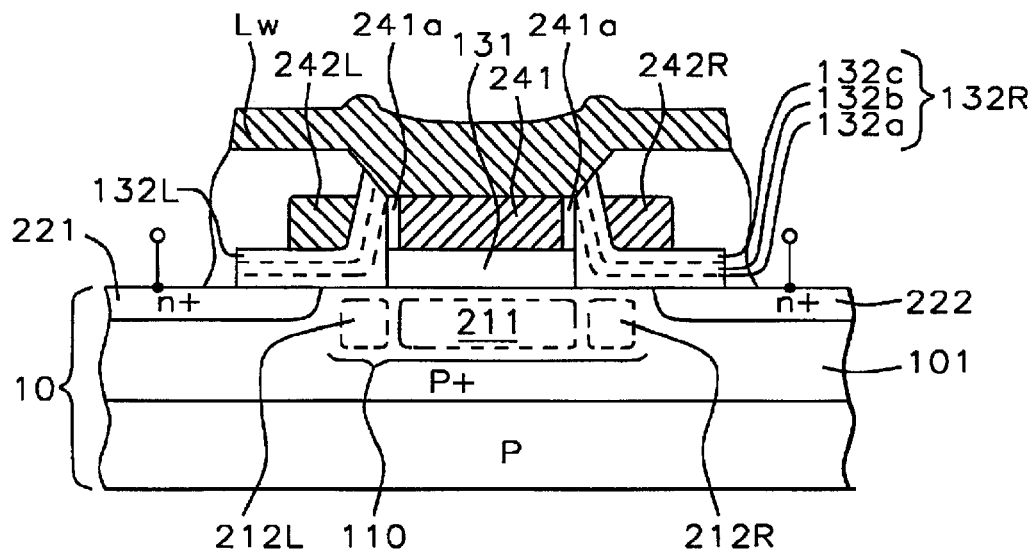
FIG. 18 shows a section of a nonvolatile memory cell in a tenth embodiment of the present invention.

In the ninth embodiment of the present invention, however, the word line ($L_W$) is connected to the first gate electrode (241) after forming a second gate insulator (132) on the entire upper surface of the first gate electrode (241) and by having an upper surface thereof exposed. As shown in FIG. 18, the insulator (132) becomes thin in thickness at an upper portion of the gate electrode (241) and the insulation effect on the upper portion is deteriorated. In the case of the foregoing, an end surface of the gate electrode (241) can be oxidized to form an oxide film (241a) or in place of the oxide film (241a), a side-wall insulator (not shown in accompanying drawings) as insulating material may be formed on a side surface of the gate electrode (241) as a tenth embodiment shown in FIG. 18.

As described above, the high speed and low voltage programming is achievable since it is possible to reduce the capacitance between each gate if each gate electrode is insulated together with not only gate insulators but also other insulators.

Figure 19:
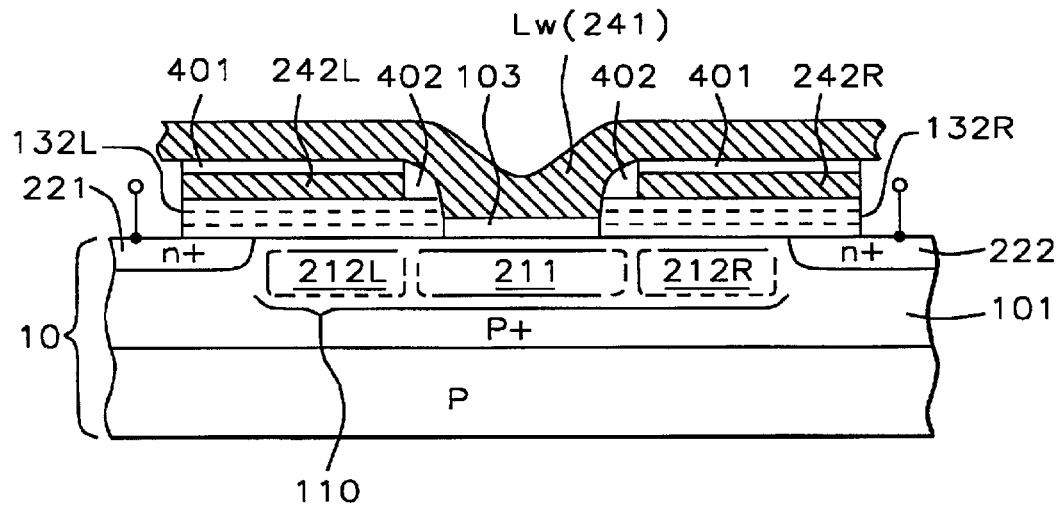
FIG. 19 shows a section of a nonvolatile memory cell in a eleventh embodiment of the present invention.

FIG. 19 shows a section of a nonvolatile memory cell in a eleventh embodiment of the present invention. The same symbols as those used in the previous description represent the same or corresponding portions therein.

According to the eleventh embodiment of the present invention, each of the second gate insulators (132L) and (132R) is of a three-layer structure as described above, while the first and second gate electrodes are insulated from each other by the insulator (401) formed on a surface of each of the second gate electrodes (242L) and (242R) and a side-wall insulator (402) formed on a side surface of each of the second gate electrodes (242L) and (242R). Further, part of the second gate insulator (132) is etched to reform the first gate insulator (103). The same advantage as that in the embodiments of the present invention is achievable in this eleventh embodiment.

Figure 20:
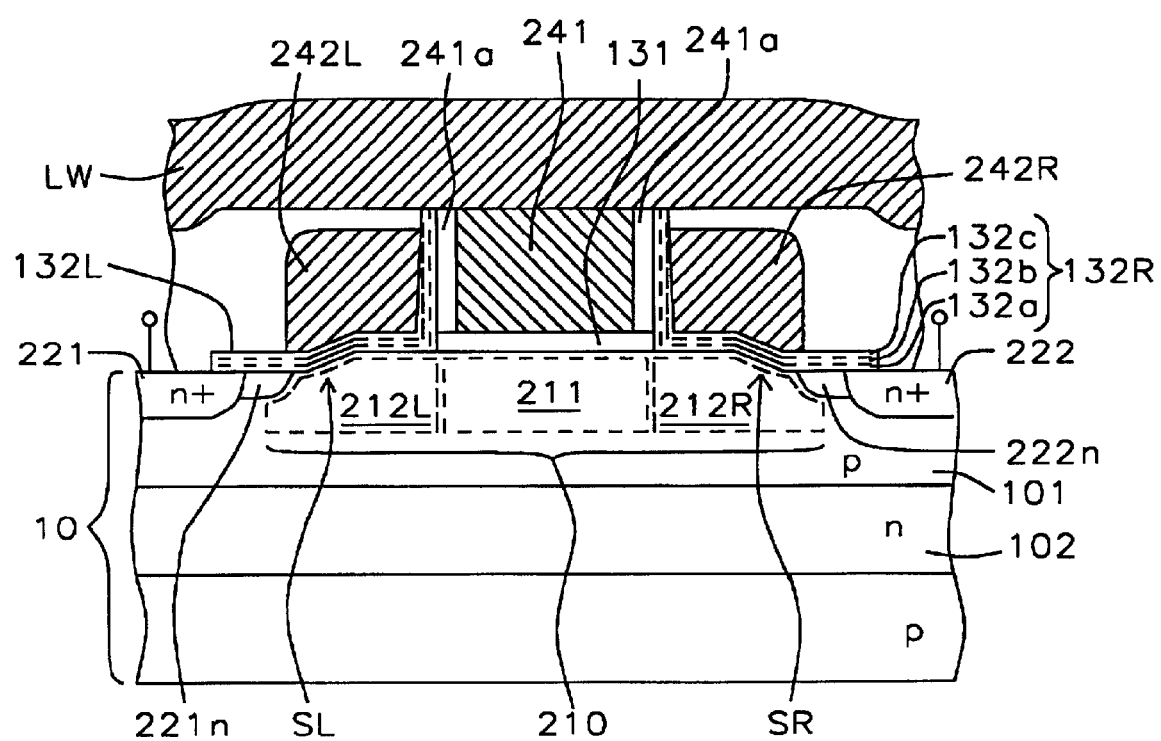
FIG. 20 shows a section of a nonvolatile memory cell in a twelfth embodiment of the present invention.

FIG. 20 is an illustration showing a section of a twelfth embodiment of the present invention. The same symbols as those used in the previous description represent the same or corresponding portions therein. This embodiment is featured in that steps SL and SR are disposed on a surface of said each carrier-acceleration-injection portion 212L and 212R.

The steps SL and SR are applicable to any of embodiments of the present invention, but provided below is the description referring to a twelfth embodiment of the present invention used for describing the illustration 20.

The first and second $n^+$ regions 221 and 222 have their respective n-type n regions 221n and 222n which are shallow and relatively low in a concentration (1E19-1E20 atm/$cm^3$). The impurity concentration of the n regions 221n and 222n is lower than that (1E21-1E20 atm/$cm^3$) of the $n^+$ regions 221 and 222 and the n regions 221n and 222n are disposed to not only improve the breakdown voltage between the carrier-acceleration-injection portions 212L and 212R and but also induce a carrier path in the vicinity of a surface of a semiconductor by shallowing the depth of the n regions. The structure as described above is applicable to each of the embodiments of the present invention.

The n regions 221n and 222n are disposed on a portion not beyond a top of each of steps SL and SR, that is, so that a part of each of the n regions may not be located at the top thereof. A top of each of steps SL and SR is disposed within the distance of a space charge region extended from n regions 221n and 222n to the carrier-acceleration-injection portions 212L and 212R. A step difference of each of the steps SL and SR is preferably within 110 nm and the step difference may be of a slope or a perpendicularity as shown in the illustration.

Figure 21:
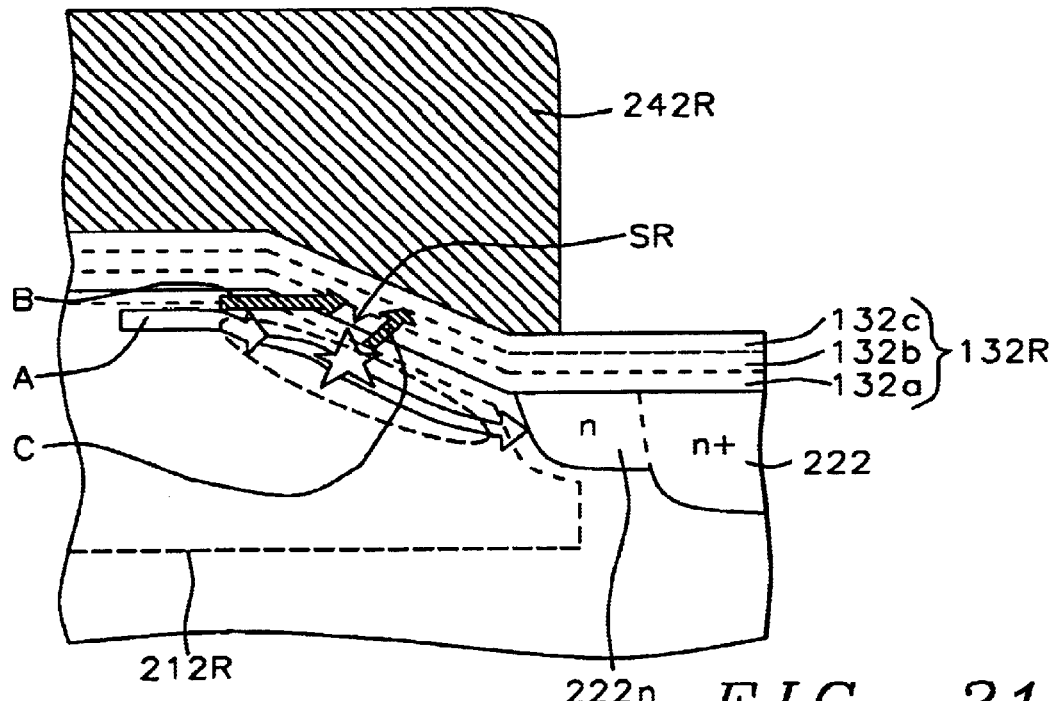
FIG. 21 is an illustration showing a carrier injection in an embodiment of the present invention in FIG. 20.

Next, described below is a function of the step SR (SL) referring to FIG. 21. Carriers supplied from the carrier-supplying portion 211 to an adjacent surface of the carrier-acceleration-injection portion (a white arrow A) 212R and accelerated in the portion have large energy in the transport direction. Since the step SR has a vertical component in the transport direction, part of the carriers (a black arrow B) is directly injected from the step SR into the second one of the second gate insulator 132R without being affected by lattice scattering and trapped in a carrier charge trapping means. This permits the carrier injection quantity to be more than one order of magnitude larger compared to the case where there is no step SR on a surface of the carrier-acceleration-injection portion 212R.

Furthermore, the step structure as described above makes a carrier path move near to a surface of the step in the carrier-acceleration-injection portion. Thus, the co-operative effect of the acceleration potential supplied to the $n^+$ region 222 and the attracting electrical potential supplied to the second one of the second gate electrode 242R is effectively applied to the carriers not injected and left in the carrier-acceleration-injection portion 212R and makes it possible to prevent the energy of the carriers from being attenuated which results in making efficient local injection (a black arrow C) of the carriers into the second one of the second gate insulator at the adjacent interface with $n^+$ region (n region 222n).

Figure 22:
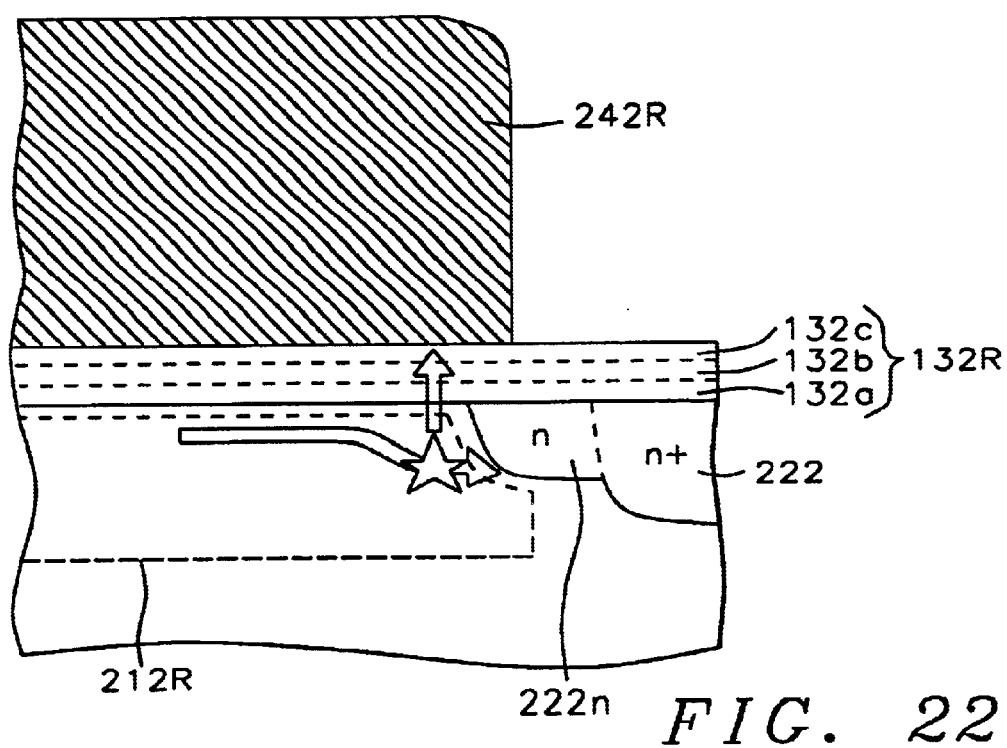
FIG. 22 is an illustration showing the carrier injection by a flat-surfaced carrier-acceleration-injection region technology.

Contrary to the foregoing, as shown in FIG. 22, if a surface of the carrier-acceleration-injection portion 212R is flat and the electrical potential for attracting a carrier is small, the carrier is moved from the surface of the carrier-acceleration-injection portion 212R to the inside thereof as the carrier approaches from a pinch-off point to the $n^+$ region 222. Even if the carrier to which energy is supplied in the carrier-acceleration-injection portion is scattered and injected into the gate insulator 132R, the carrier injection quantity becomes smaller by one order of magnitude if the distance which is required for the carrier to reach a surface of the carrier-acceleration-injection portion is, for example, longer than 2.3 times the mean free path.

According to the aforesaid embodiment of the present invention, it is possible for a carrier to move in a surface of the carrier-acceleration-injection portion 212R even if the electrical potential for attracting the carrier is small. This enables high efficiency local injection.

A well structure shown in FIG. 20 is called a triple well which is a two-layer structure comprising n-well 102 and p-well 101. This triple well structure enables applying either positive or negative bias to the p-well with respect to a semiconductor substrate. Also, the triple well structure as described above is applicable to each of the aforesaid embodiments of the present invention.

Figure 23:
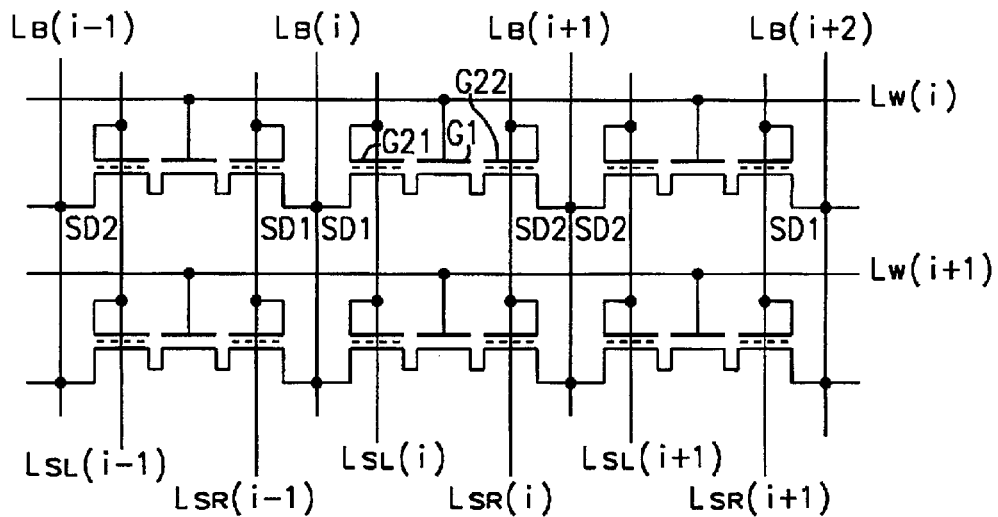
FIG. 23 is an illustration showing a circuit configuration (First embodiment) of a memory cell in FIG. 20.

Next, provided is the description of a nonvolatile memory array so configured and structured that a nonvolatile memory cell is aligned in the form of a matrix. FIG. 23 shows an example of a first configuration for the nonvolatile memory array and FIG. 24, an example of a second configuration for the nonvolatile memory array.

In FIG. 23, each of $n^+$ $SD_1$ (221) and $SD_2$ (222) of memory cells adjacent to a direction of a row is commonly connected and in the direction of a column is connected by a bit line ($L_B$). A first gate electrode $G_1$ (241) in a column is connected by a word line ($L_W$). A first one of a second gate electrode $G_{21}$ (242L) in a column is connected by a first control line ($L_{SL}$) and a second one of a second gate electrode $G_{22}$ 242R) in a column is connected by a second control line ($L_{SR}$)

Figure 24:
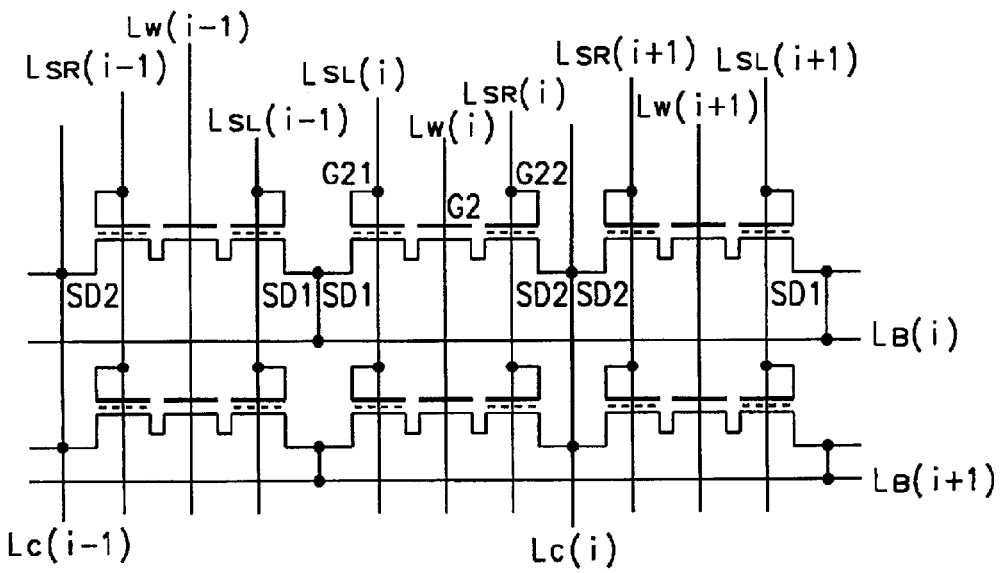
FIG. 24 is an illustration showing a circuit configuration (Second embodiment) of a memory cell in FIG. 20.

In FIG. 24, a first $n^+$ region $SD_1$ (221) in each nonvolatile memory cell in a same row is connected by a bit line ($L_B$). A second $n^+$ region $SD_2$ (222) of memory cells adjacent to the direction of a row in a column is connected by a common line ($L_c$). A first gate electrode $G_1$ (241) in a column is connected by a word line ($L_W$). A first one of a second gate electrode $G_{21}$ (242L) in a column is connected by a first control line ($L_{SL}$) and a second one of a second gate electrode $G_{22}$ (242R) in a column is connected by a second control line ($L_{SR}$).

Figure 25:
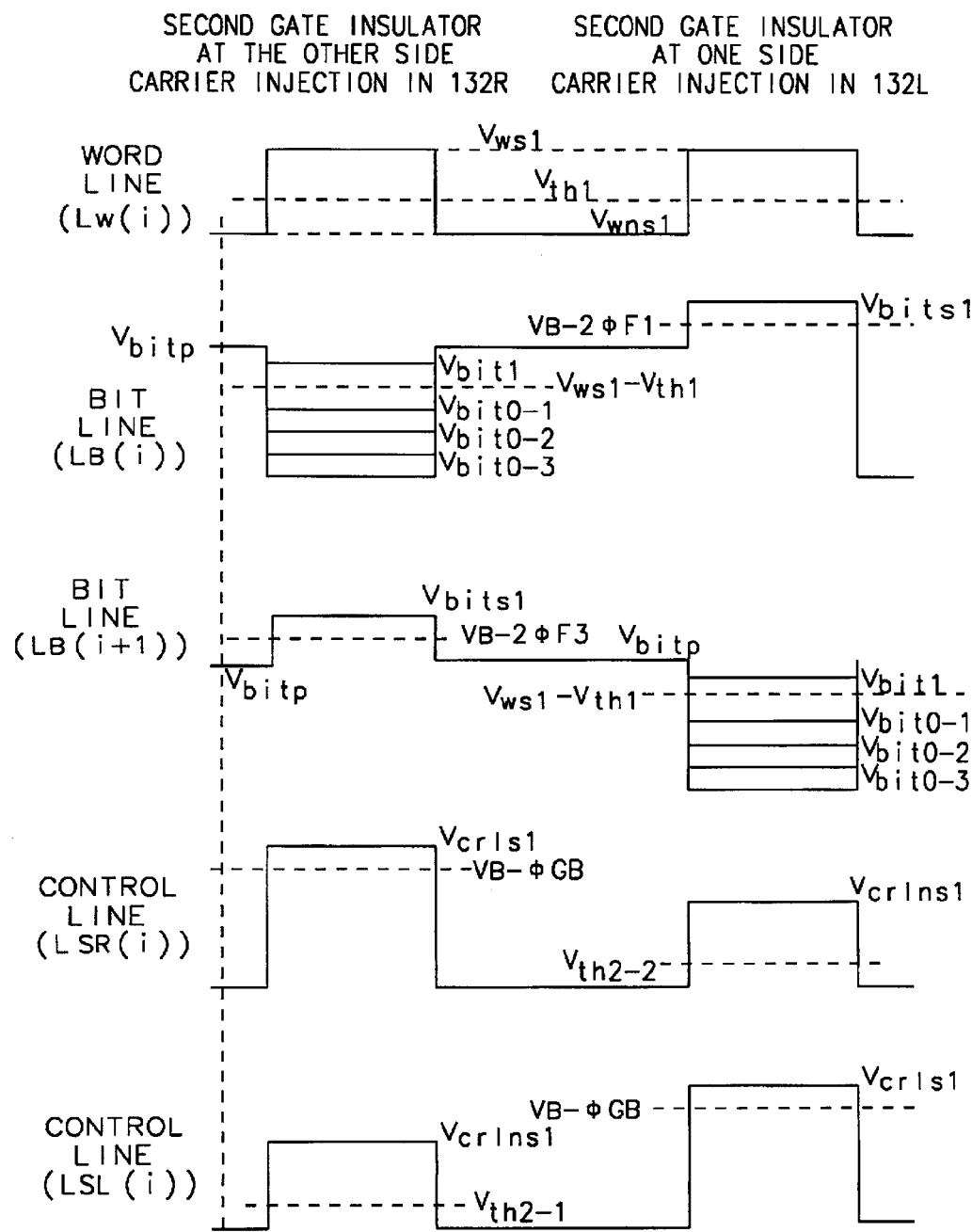
FIG. 25 is a signal waveform illustration showing a method of programming a memory cell in FIG. 20.

FIG. 25 shows electrical potential supplying conditions applicable when programming a cell between a bit line $L_B$(i) and bit line $L_B$(i+1) out of memory cells constituting an array in FIG. 23.

(1) Carrier Injection into the Second One of the Second Gate Insulator 132R:

An electrical potential of the bit line $L_B$(i) is predetermined to be an electrical potential $V_{bitp}$ which is higher than the value obtained by subtracting the threshold voltage $V_{th1}$ of the first gate electrode 241 from the electrical potential $V_{Ws1}$ of a selected word line $L_W$(i).

Next, an electrical potential $V_{Ws1}$ which is higher (at the absolute value) than the threshold voltage $V_{th1}$ of the first gate electrode 241 is supplied to a selected word line $L_w$(i); an acceleration-electrical potential $v_{bits1}$ which is higher than ($V_B$−$2\phi_{F3}$), to the bit line $L_B$(i+1); the electrical potential for attracting a carrier $V_{crls1}$ which is higher than the value ($V_B$−$\phi_{GB}$), to a control line $L_{SR}$(i); the electrical potential $V_{crlns1}$ which is higher than the gate threshold voltage $V_{th2-1}$ of the first one of the second gate electrode 241L, to the control line $L_{SL}$(i); and an electrical potential $V_{WDs1}$ which is lower than the gate threshold voltage of said first gate electrode 241, to unselected word lines (A reference point covering the electrical potentials as described so far is a channel forming semiconductor region.)

After the electrical potential $V_{Ws1}$ is supplied to the word line $L_W$ (i), the electrical potential of the bit line $L_B$(i) is changed and programming information is selected by a difference value [$V_{bit1}$ higher than ($V_{WS1}$−$V_{th1}$) or $V_{bit0}$ lower than ($V_{WS1}$−$V_{th1}$)].

According to the electrical potential supplying method as described above, the same electrical potential is determined to be supplied to a bit line $L_B$ (i) starting from a bit line $L_B$ (i+1) every other line and more particularly, determined to be $V_{bit1}$ or $V_{bit0}$ from the bit line $L_B$(i) every other line in response to the programming information. A description was made to the two-value with respect to the selected electrical potential for the information, but it is possible to program multivalue information, if $V_{bit0}$ is used as multilevel ($V_{bit0-1}$, $V_{bit0-2}$ and $V_{bit0-3}$).

(2) Carrier Injection in the First One of the Second Gate Insulator 132L:

An electrical potential of a bit line $L_B$(i+1) is predetermined to be the electrical potential $V_{bitp}$ which is higher than the value obtained by subtracting the threshold voltage $V_{th1}$ of the first gate electrode 241 from the electrical potential $V_{WS1}$ of a selected word line $L_W$ (i).

Next, an electrical potential $V_{WS1}$ which is higher (at the absolute value) than the threshold voltage ($V_{th1}$) of the first gate electrode 241 is supplied to the selected word line $L_w$; the acceleration-electrical potential $V_{bits1}$ which is higher than ($V_B-2\phi_{F1}$), to a bit line $L_B$(i); the electrical potential for attracting a carrier $V_{crls1}$ which is higher than the value ($V_B-\phi_{GB}$), to a control line $L_{SR}$(i); the electrical potential $v_{WDs1}$ which is higher the gate threshold voltage $V_{th2-2}$ of the second one of the second gate electrode 242R, to a control line $L_{SR}$(i); and the electrical potential $V_{WDs1}$ which is lower than the gate threshold voltage of said first gate electrode 241, to unselected word lines (A reference point covering the electrical potentials as described so far is a channel forming semiconductor region.)

After the electrical potential $V_{WS1}$ is supplied to the word line $L_W$, the electrical potential of said bit line $L_B$(i+1) is changed and programming information is selected by the difference value [$V_{bit1}$ higher than ($V_{WS1}-V_{th1}$) or $V_{bit0}$ lower than ($V_{WS1}-V_{th1}$)].

According to the electrical potential supplying method as described above, the same electrical potential is determined to be supplied to a bit line $L_B$(i) starting from a bit line $L_B$(i+1) every other line and more particularly, determined to be $V_{bit1}$ or $V_{bit0}$ from the bit line $L_B$(i+1) every other line in response to the programming information. A description was made to the two-value with respect to the selected electrical potential for the information, but it is possible to program multivalue information, if $V_{bit0}$ is used as multi-level ($V_{bit0-1}$, $V_{bit0.2}$ and $V_{bit0-3}$).

As described above, programming according to an embodiment of the present invention is to be carried out as per one cell. With respect to the carrier injection in the adjacent two cells, while injecting a carrier in the second one of the second gate insulator 132R in one cell, it is possible to inject the carrier in the first one of the second gate insulator 132L in the other cell. However, if the programming information is different, it is required for the adjacent cells to carry out the programming two times. In the step as described above, if the standby electrical potential is supplied to the control line $L_{SL}(L_{SR})$, the cell concerned is not programmed.

Figure 26:
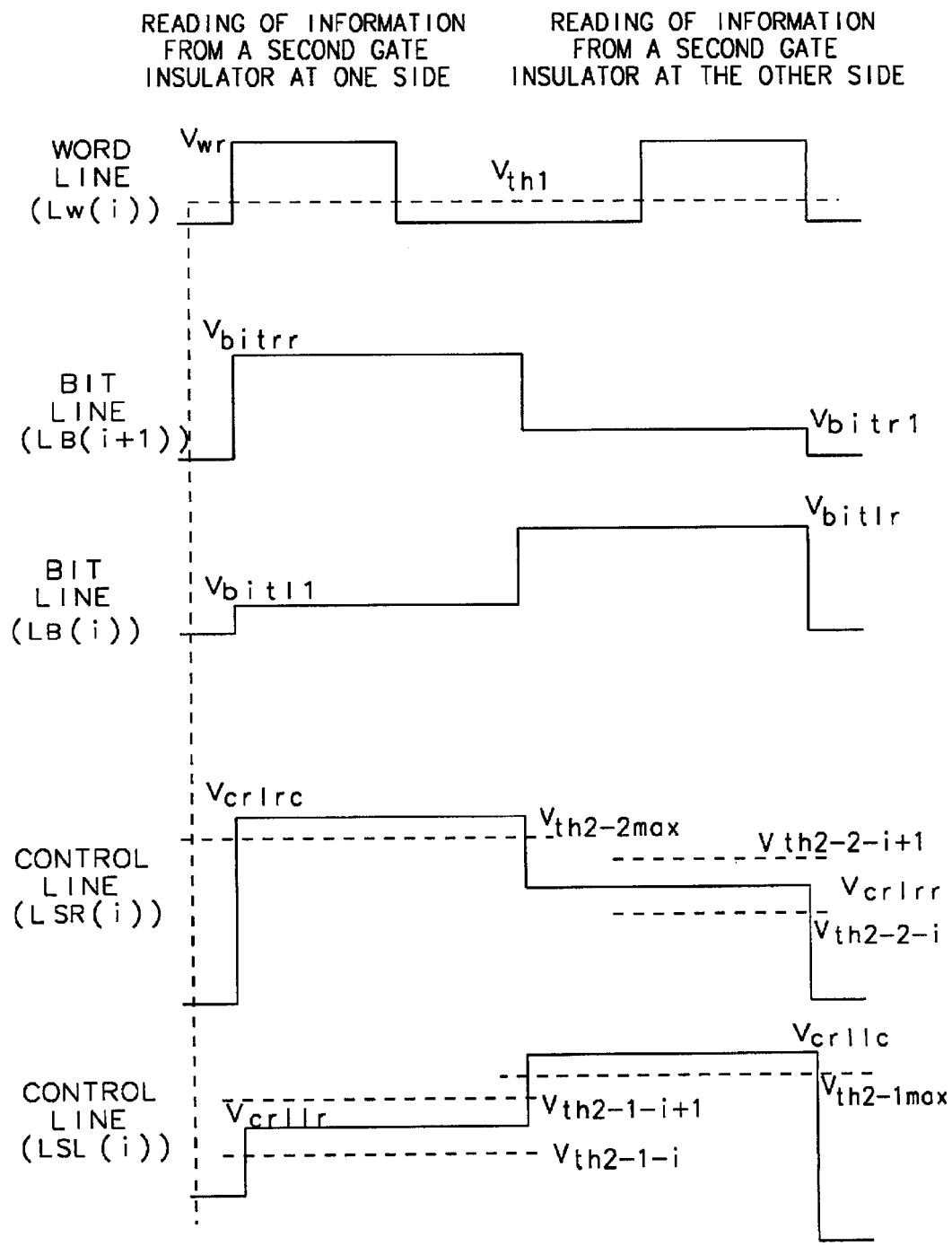
FIG. 26 is a signal waveform illustration showing a method of reading a memory cell in FIG. 20.

Next, referring to FIG. 26, described below are electrical potential supplying conditions applicable when reading the information stored in each memory cell of the array.

(1) Reading of the Information Stored in the First One of the Second Gate Insulator 132L:

An electrical potential $V_{wr}$ which is higher than the first gate threshold voltage $V_{th1}$ is supplied to a selected word line $L_W$ (i) and the electrical potential $V_{bit1r}$ in a reverse direction to the channel forming semiconductor region 110, to a bit line $L_B$(i). The electrical potential $V_{bit1r}$ is the one which is lower than the value ($V_B-2\phi_{F2}$).

Furthermore, the electrical potential $V_{bit11}$ which is lower (including zero) than the electrical potential $V_{bitrr}$ is supplied to a bit line $L_B$ (i); the electrical potential $V_{crlrc}$ which is higher (at the absolute value) than the maximum value $V_{th2-2max}$ of the second one of the second gate threshold voltage, to the control line $L_{SR}$ (i); and the electrical potential between a plurality of the programmed first one of the second gate threshold voltage $V_{th2-1-i}$ and $V_{th2-1-(i+1)}$, to a control line $L_{SL}$(i). It is judged from the aforesaid step that if a current is flowed to the $L_B$(i+1), the first one of the second gate threshold voltage is less than the value $V_{th2-1-i}$ and if not, the voltage is more than value $V_{th2-1-(i+1)}$.

(2) Reading of the Information Stored in the Second One of the Second Gate Insulator 132R:

An electrical potential $V_{wr}$ which is higher than the first gate threshold voltage $V_{th1}$ is supplied to a selected word line $L_W$ (i) and the electrical potential $V_{bitlr}$ in a reverse direction to the channel forming semiconductor region 110, to a bit line $L_B$(i+1). The electrical potential $V_{bitlr}$ is the one which is lower than the value ($V_B-2\phi_{F2}$).

Furthermore, the electrical potential $V_{bitlr}$ which is lower (including zero) than the electrical potential $V_{bitlr}$ is supplied to a bit line $L_B$ (i+1); the electrical potential $V_{cllc}$ which is higher (at the absolute value) than the maximum value $V_{th2-1max}$. of the first one of the second gate threshold voltage, to a control line $L_{SR}$(i); and the electrical potential between a plurality of the programmed second one of the second gate threshold voltage $V_{th2-2-i}$ and $V_{th2-2-(i+1)}$, to a control line $L_{SR}$(i). It is judged from the aforesaid step that if a current is flowed to the $L_B$(i), the second one of the second gate threshold voltage is less than the value $V_{th2-2-i}$ and if not, the voltage is more than the value $V_{th2-2-(i+1)}$.

Current detection may be conducted by detecting the current itself or detecting electrical potential change in the bit line $L_B$ charged to the specified electrical potential within a predetermined time. Also, the $V_{th}$ level less than $V_{t2-l-i}$ and $V_{th2-2-i}$ can be judged depending on the value of a current to be detected.

Next, described is a manufacturing method referring to FIGS. 27–34 showing sections of a memory array manufactured in an array configuration of the memory cell disclosed in a twelfth embodiment of the present invention with respect to FIG. 20.

Figure 27:
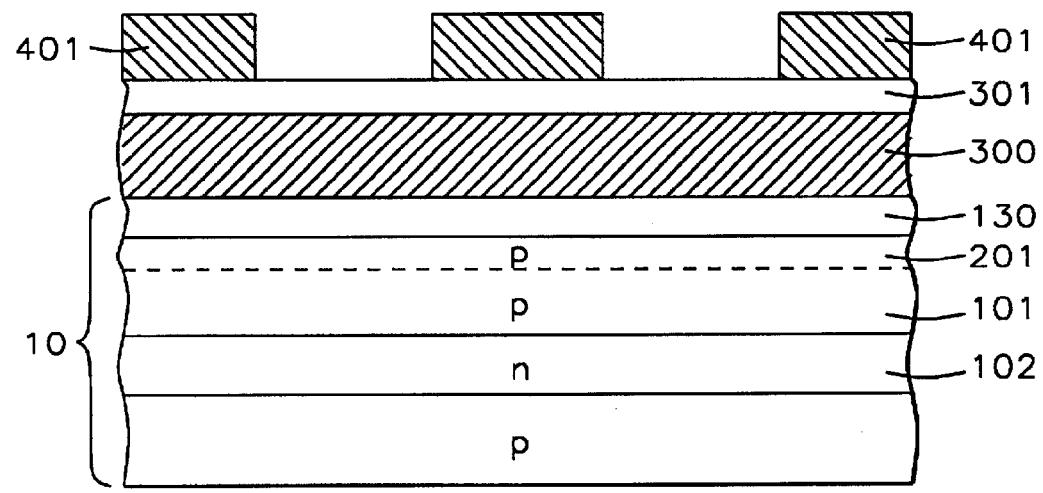
FIG. 27 is a sectional view of a nonvolatile memory cell in FIG. 20 showing a manufacturing method (First embodiment) of it.

As shown in FIG. 27, n-well 102 and p-well 101 are formed in a surface of p type semiconductor substrate 10 and a surface of the p-well 101 is oxidized to form a thermal oxide film with thickness of 5 nm. A surface layer 201 is then formed by introducing by ion implantation in a surface of the p-well impurity (boron according to the twelfth embodiment of the present invention) to be an impurity for the carrier-supplying portion in a subsequent step.

Next, the thermal oxide film is removed by wet etching and a thermal oxide film 130 with thickness of 7 nm is again formed on a surface of the p-well 101 by pyrogenic oxidization at 800° C. A phosphorous-doped polysilicon thin film 300 with thickness of 200 nm is further formed and a silicon nitride film 301 with thickness of 100 nm is then formed. In addition, a photoresist is coated on a surface of a substrate and is patterned to a shape of the first gate electrode 241, resulting a photoresist mask 401.

Figure 28:
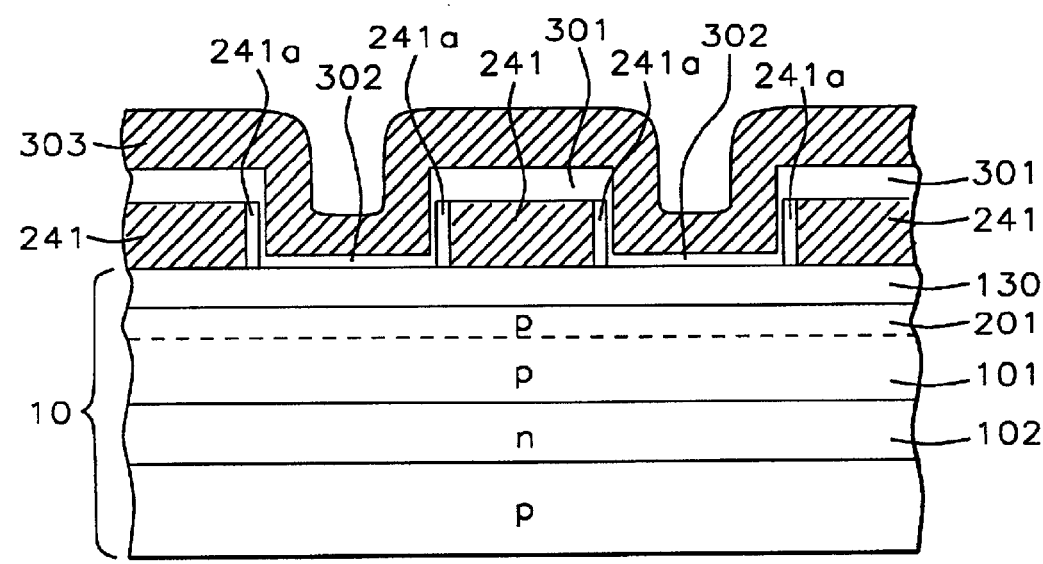
FIG. 28 is a sectional view of a nonvolatile memory cell in FIG. 20 showing a manufacturing method (Second embodiment) of it.

Next, the silicon nitride film 301 and polysilicon thin film 300 are etched using the photoresist 401 as a mask as shown in FIG. 28. A polysilicon film 300 is thus fabricated to the shape of the first electrode 241.

After the patterned polysilicon film is cleaned a thermal oxide film 241 a with thickness of 30 nm is grown on sidewalls of the first gate electrode (polysilicon) 241 by pyrogenic oxidization at 800° C. A silicon nitride film 302 is formed evenly over the surfaces to be 10 nm thick and further, a polysilicon layer 303 is formed uniformly to be 80 nm in film thickness.

Figure 29:
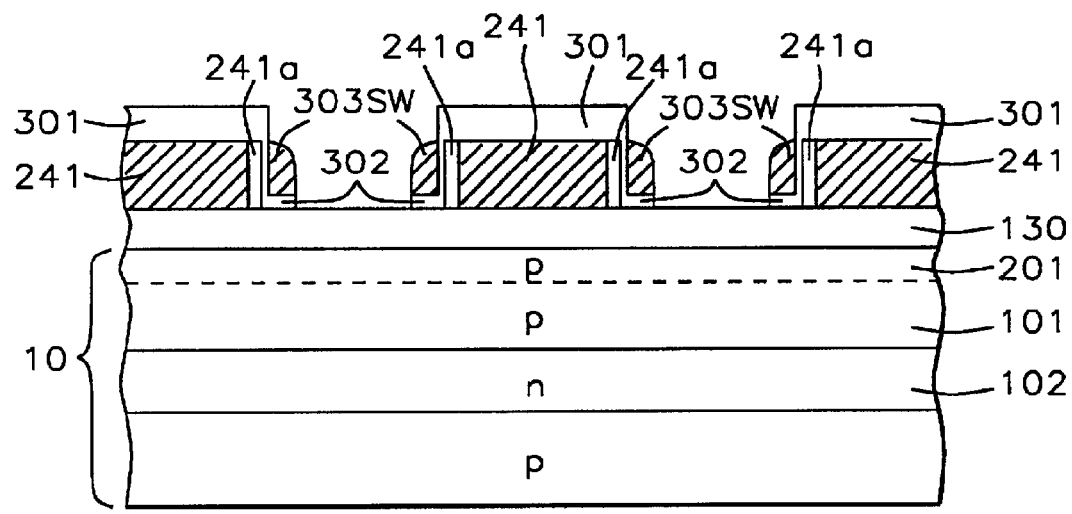
FIG. 29 is a sectional view of a nonvolatile memory cell in FIG. 20 showing a manufacturing method (Third embodiment) of it.

Next, as shown in FIG. 29, a horizontal portion of the polysilicon 303 is etched by a so-called reactive ion etching (RIE) and a sidewall 303SW is left close to a side surface of the first gate electrode 241. Further, the silicon nitride film 302 is etched using the polysilicon sidewall 303SW as a mask. In the process as described above, the silicon nitride film 301 on a surface of the first gate electrode is left thereon since the silicon nitride film 301 is thicker than the silicon nitride film 302.

Figure 30:
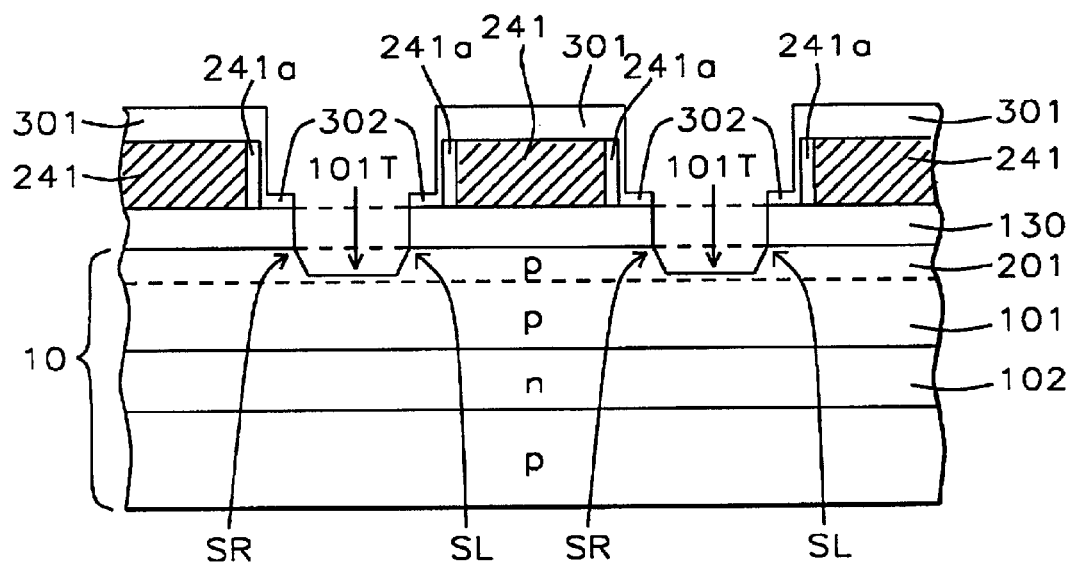
FIG. 30 is a sectional view of a nonvolatile memory cell in FIG. 20 showing a manufacturing method (fourth embodiment) of it.

Then, as shown in FIG. 30, the polysilicon side wall 303 SW close to a side surface of the first gate electrode 241 is removed by an isotropic etching method and the silicon oxide film 130 is etched using as a mask the silicon nitride film 302 left beneath the now removed polysilicon sidewall and side surface of the polysilicon.

Next, a surface of the p-well is etched to the depth of 50 nm using as masks the silicon nitride film 302 and the silicon oxide film left as a result of the process as described above. Side surfaces of an etched trench 101T become steps SL and SR to be formed in each surface of carrier-acceleration-injection portions 212L and 212R in the subsequent process. A bottom surface of the etched trench 101T becomes n$^+$ regions 221 and 222 in its greater parts.

However, when etching a trench 101 T using an isotropical etching technology, side etching is also carried out (Provided hereinafter below is a description of utilizing this side etching with reference to FIG. 31.). After a 5 nm thick thermal oxide film is grown, arsenic forming the regions 221n and 222n is injected by low energy (less than 10 KeV) ion implantation in advance using as masks the silicon oxide film 130 and silicon nitride film 302. This ensures self-alignment of the steps SL and SR with n$^+$ regions 221 and 222 since the positioning is carried out using the same mask. In the process as described above, the arsenic implantation for the n regions 221n and 222n is not required which will be described hereinafter below relating to FIG. 32.

Figure 31:
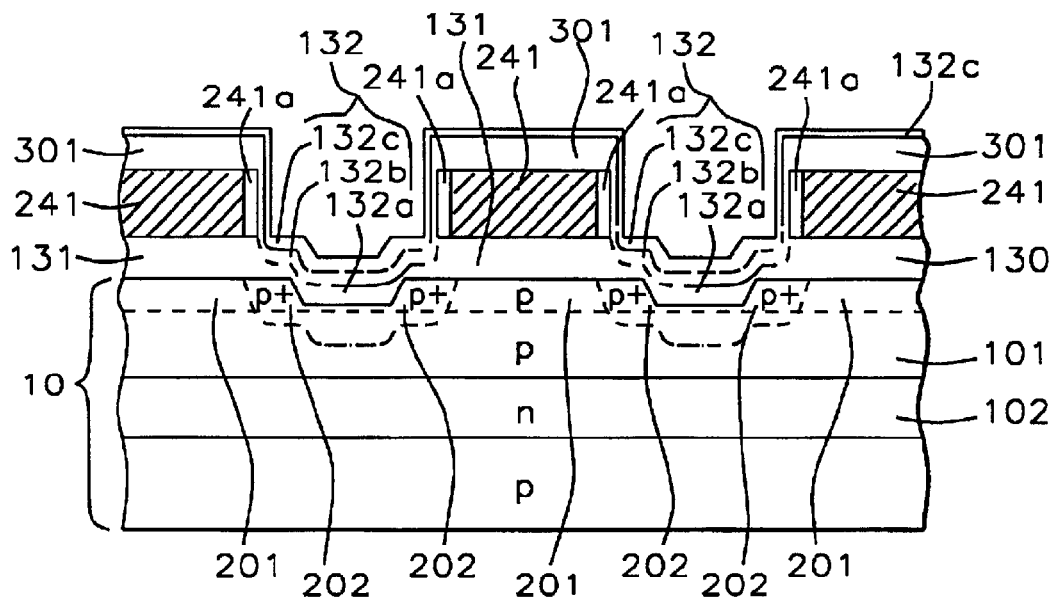
FIG. 31 is a sectional view of a nonvolatile memory cell in FIG. 20 showing a manufacturing method (Fifth embodiment) of it.

Next, as shown in FIG. 31, a thermal oxide film (not shown in a figure) with thickness of 5 nm is formed in the etched trench 101T and then, the silicon nitride film 302, thermal oxide film 130 and the thermal oxide film in the etched trench are etched in their order and a well surface between the first electrodes is exposed.

Furthermore, a silicon oxide film 132a to be a first layer for each of the second gate insulators 132L and 132R is formed to be 3.5–4 nm thick by a pyrogenic oxidization method at 800° C. Then, a silicon nitride film 132b to be a second layer is formed to be 4 nm thick by a CVD method and a silicon oxide film 132c to be a third layer is formed to be 3–3.5 nm thick by a CVD method. Thereafter, the silicon oxide film 132b is oxidized by a pyrogenic oxidization method at 800° C. The process as described above completes formation of a second gate insulator 132 which is of a three-layer structure incorporating a carrier charge trapping means. A first gate insulator 131 is already formed with self-alignment to the first gate electrode 241.

Figure 32:
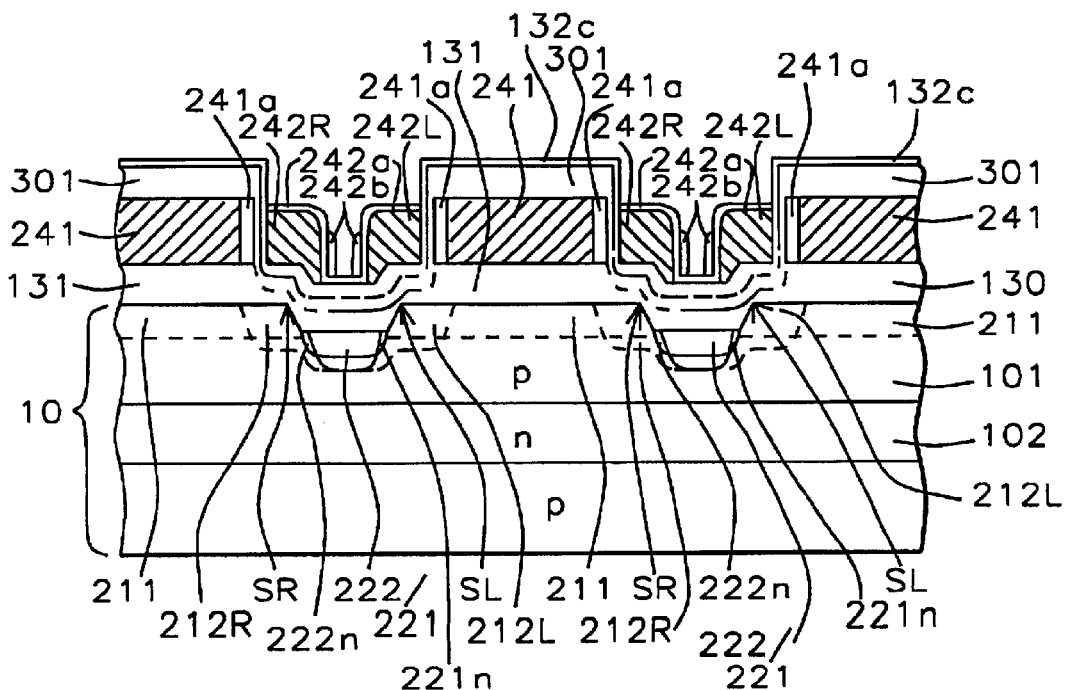
FIG. 32 is a sectional view of a nonvolatile memory cell in FIG. 20 showing, a manufacturing method (Sixth embodiment) of it.

Next, as shown in FIG. 32, a polysilicon film (not shown in the figure) as a protective film for the second gate insulator 132 is formed uniformly to be 10 nm film thick. Implanted through gate insulators by an ion implantation method is a first conductivity type impurity (boron according to the embodiment of the present invention) to be impurity in the carrier-acceleration-injection portions 212L and 212R in a subsequent process. The impurity in the carrier-acceleration-injection portions 212L and 212R is implanted to form the carrier-acceleration-injection portion self-aligned to the first gate electrode 241 by using itself as a mask.

The phenomenon as described above results in that when forming a first one of a second gate electrode 242L and second one of the second gate electrode 242R adjacent to a side wall of a first gate electrode 241 which is described hereinafter below relating to FIG. 32, the impurity 202 in the carrier-acceleration-injection portion is self-aligned to the first one of the second gate electrode 242L and second one of the second gate electrode 242R.

Next, as shown in FIG. 32, a phosphorous doped polysilicon is formed evenly to be 100 nm thick (not shown in a figure) and a horizontal portion thereof is etched by an anisotropical RIE method, polysilicon side walls 242L and 242R being left adjacent to a side surface of the first gate electrode 241. The phosphorous doped side wall becomes the first one of the second gate electrode 242L and second one of the second gate electrode 242R. In the process as described above, a protective polysilicon is also etched as referred to in FIG. 31. Further, an oxide film 242a with film thickness of 7 nm is formed on a silicon side wall surface via a pyrogenic oxidization method at 800° C.

Next, implanted by an ion implantation method in a surface of the etched trench is n region impurity (arsenic according to the twelfth embodiment of the present invention) using as masks polysilicon sidewalls 242L and 242R to form n regions 221n and 222n. This enables automatic adjustment of each position of an end portion of the n region and steps SL and SR of carrier-acceleration-injection portion. Then, a silicon nitride film (not shown in the figure) is formed evenly to have a 30 nm film thickness by a CVD method and a horizontal portion thereof is etched by an anisotropic RIE method, a sidewall 242b of a silicon nitride film being left at each side of polysilicons 242L and 242R.

Furthermore, implanted in a surface of the etched trench by an ion implantation method using the silicon nitride film as a mask is impurity (arsenic according to the twelfth embodiment of the present invention) to form the n$^+$ regions 222 and 221 whose dose is larger by one to two orders of magnitude than that of the impurity of the n regions 221n and 222n. Thereafter, the ion-implanted impurity is heat-treated and activated.

Figure 33:
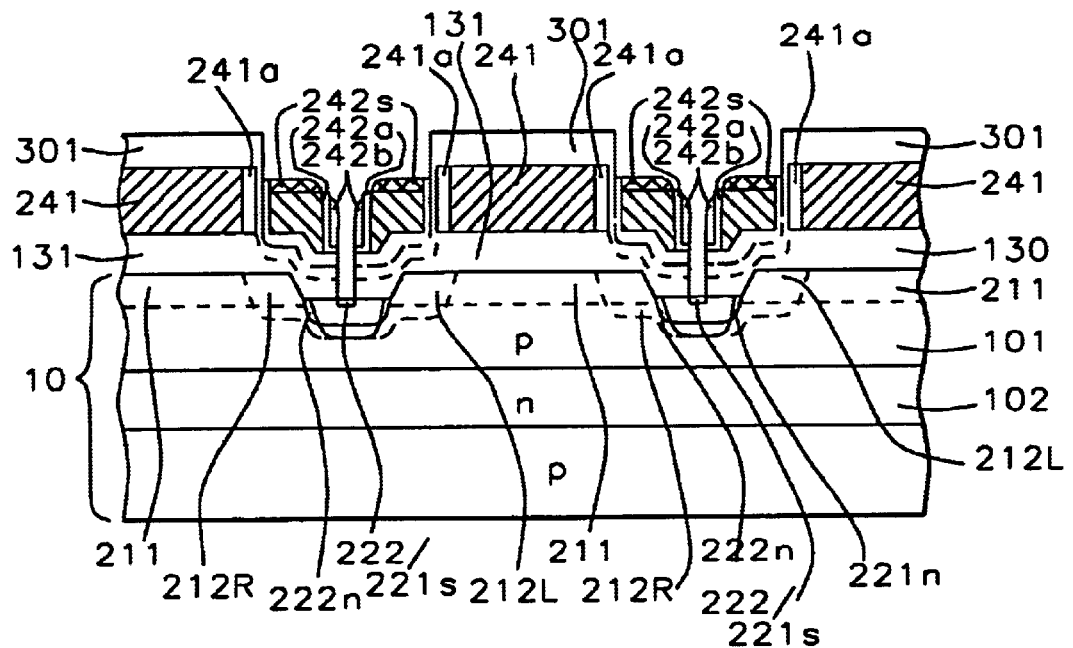
FIG. 33 is a sectional view of a nonvolatile memory cell in FIG. 20 showing a manufacturing method (Seventh embodiment) of it.

Next, as shown in FIG. 33, the oxide film on the polysilicon sidewall is etched and the three-layer film 132 left between silicon nitride films 242b is etched away. Further, after titanium or cobalt is evaporated on an entire surface, the evaporated titanium or cobalt film is heat-treated. The portions which are exposed to the outside by etching, i.e. an upper surface of the polysilicon side wall and high concentration portions of n$^+$ regions 222/221s, are silicided. Any metal which has not yet been reacted is etched to be removed.

The low resistance n$^+$ regions 222/221 and the first one and second one of the second gate electrode 242L, 242R are formed through the process as described above and low resistance bit lines, common lines and control lines can be formed by continuously forming n$^+$ regions and electrodes in other cells.

Figure 34:
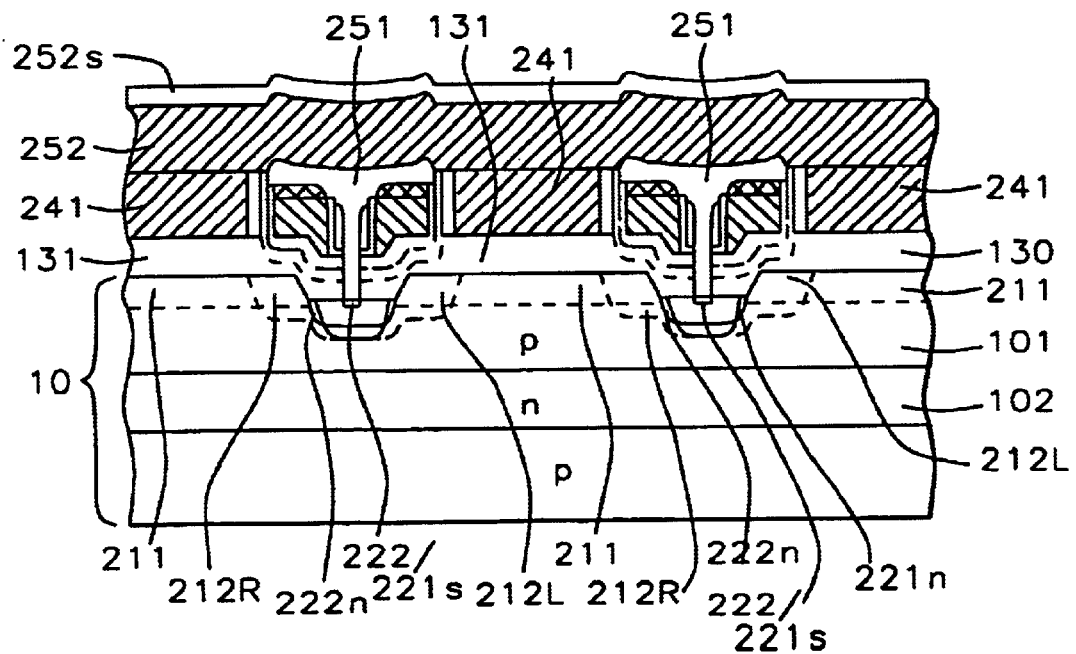
FIG. 34 is a sectional view of a nonvolatile memory cell in FIG. 20 showing a manufacturing method (Eighth embodiment) of it.

Next, as shown in FIG. 34, a silicon oxide film 251 is formed by a CVD method to make film thicker than that of the first gate electrode 241 and left only between the first gate electrodes. Further, the silicon nitride film 301 on an exposed upper surface of the first gate electrode is selectively etched (to the silicon oxide film) and the first gate electrode is exposed to form by a CVD method phosphorous doped polysilicon 252 to be 100 nm thick. In addition, tungsten silicide 252s is formed by a CVD method on the phosphorous doped polysilicon 252 to be 50 nm thick and the first gate electrodes 241 of a plurality of cells are connected each other. A two-layer film comprising said tungsten silicide 252S and polysilicon 252 is fabricated fitted to a plane shape of the word line $L_w$ based on the well known lithography technology.

Furthermore, a bit line, a common line, a word line and control line are connected to peripheral circuits using multilayer interconnection technology. To connect a control line to a peripheral circuit, it is required to form a connection-pad shaped photoresist at a stage prior to the anisotropic poly-silicon etching.

Provided below are advantages according to the present invention.

(1) When injecting a carrier in a gate insulator with a carrier charge trapping means from a channel forming semiconductor region, local carrier injection is possible getting over a potential barrier from a portion (the adjacent interface with the second n$^+$ region 122 out of carrier-acceleration-injection portions) of the channel forming semiconductor region. This results in not only enabling high efficiency injection and low voltage and high speed programming but also providing a high integration density memory cell.

(2) Two gate electrodes are independently formed over a channel forming semiconductor region and an electrical potential for attracting a carrier is supplied to a gate electrode formed in a region in which the carrier is locally injected. This enables high efficiency injection in the gate insulator owing to the interaction between the acceleration-electrical potential to be supplied to the n$^+$ region 122 and the electrical potential for attracting a carrier even if the number of the carriers to be supplied from the first n$^+$ region 121 to a channel forming semiconductor region is reduced.

(3) Second gate electrodes and insulators thereof are disposed on both sides of a first gate electrode and carrier supply and attraction are independently conducted. Furthermore, the carrier within the channel forming region can be independently injected in each of the second insulators. This results in not only enabling a memory cell to store two-bit data therein but also reducing programming current as well as in providing a high integration density memory.

(4) The carrier injection and extraction thereof to and from the second gate insulator can be conducted only by applying to the second gate electrode an electrical potential whose polarity is the same both for the injection and extraction. This simplifies circuit configuration for the carrier injection and extraction.

While the invention has been particularly shown and described with reference to the preferred embodiments thereof, it will be understood by those skilled in the art that various changes in form and detailes may be made without departing from the spirit and scope of the invention.

What is claimed is:

1. A method of programming a nonvolatile memory cell wherein first and second impurity regions of opposite conductivity type are formed in a main surface of a substrate and separated therebetween by a channel forming semiconductor region of one conductivity type in said main surface of said substrate and a gate electrode is formed on a gate insulator on said channel forming semiconductor region, carriers being injected and stored in a carrier trapping means of said gate insulator further comprising:

provided is an acceleration-electrical potential supplying means to selectively supply an acceleration-electrical potential to one out of the first and second impurity regions at one side;

said channel forming semiconductor region includes a carrier-supplying portion and a carrier-acceleration-injection portion disposed along a carrier transport direction said carrier-supplying portion supplies to said carrier-acceleration-injection portion carriers supplied by another one out of said first and second impurity regions at another side;

said carrier-acceleration-injection portion makes local injection of carriers supplied from said carrier-supplying portion into said gate insulator in the vicinity of the adjacent said one out of said first and second impurity regions at one side to which said accelerated electrical potential is supplied;

said carrier-acceleration-injection portion comprises a first carrier-acceleration-injection portion formed adjacent to said first impurity region and a second carrier-acceleration-injection portion adjacent to said second impurity region wherein said carrier-supplying portion is disposed between said first carrier-acceleration-injection portion and said second carrier-acceleration-injection portion;

said gate insulator is comprised of a first gate insulator disposed on said carrier-supplying portion and two second gate insulators disposed on said first carrier-acceleration-injection portion and said second carrier-acceleration-injection portion, respectively wherein each said gate insulator is of a three-layer structure including:

first layer coming in contact with said channel forming semiconductor region;

third layer in contact with said gate electrode; and second layer between said first layer and said third layer wherein a carrier tunnel probability of said third layer is higher than a carrier tunnel probability of said first layer;

said carrier trapping means is in said second gate insulators;

said acceleration-electrical supplying means supplies an acceleration-electrical potential to said second impurity region when injecting carriers from said second carrier-acceleration-injection portion into a second one of said second gate insulators and to said first impurity region when injecting carriers from said first carrier-acceleration-injection portion into a first one of said second gate insulators; and said gate electrode is comprised of a first gate electrode and two second gate electrodes wherein said first gate electrode, a first one of said second gate electrodes and a second one of said second gate electrodes are insulated from each other, wherein said first gate electrode is disposed above said carrier-supplying portion through said first gate insulator and said first one of said second gate electrodes is disposed above said first carrier-acceleration-injection portion through said first one of said second gate insulators, and wherein said second one of said second gate electrodes is disposed above said second carrier-acceleration-injection portion through said second one of said second gate insulators;

wherein said programming comprises steps of:

supplying to said first gate electrode electrical potential for inducing a channel which is larger than a gate threshold voltage of said corresponding gate;

predetermining electrical potential of said first impurity region to a first electrical potential which is smaller than said acceleration-electrical potential and which is larger than a value obtained by deducting said threshold voltage from said electrical potential for inducing a channel; and changing electrical potential of said first impurity region to said first electrical potential or a second electrical potential less than said value obtained by deducting said gate threshold voltage from said electrical potential for inducing a channel to select programming information.

2. A method of programming the nonvolatile memory cell according to claim 1 wherein said electrical potential for attracting a carrier is more than $V_B-\phi_{GB}$ ($\phi_{GB}$: a work function difference between a gate electrode and carrier-acceleration-injection portion).

3. A method of programming the nonvolatile memory cell according to claim 1 wherein carriers are supplied from one of said impurity regions to said carrier-supplying portion by forward-biasing said one of said impurity regions.

4. A method of programming the nonvolatile memory cell according to claim 1 wherein a carrier is supplied from one of said impurity regions to said carrier-supplying portion by inducing a channel in a surface of said carrier-supplying portion.

5. A method of programming the nonvolatile memory cell according to claim 1 wherein said second electrical potential is selected out of a plurality of levels of electrical potential.

6. A method of programming a nonvolatile memory cell wherein first and second impurity regions of opposite conductivity type are formed in a main surface of a substrate and separated therebetween by a channel forming semiconductor region of one conductivity type in said main surface of said substrate and a gate electrode is formed on a gate insulator on said channel forming semiconductor region, carriers being injected and stored in a carrier trapping means of said gate insulator further comprising:

provided is an acceleration-electrical potential supplying means to selectively supply an acceleration-electrical potential to one out of the first and second impurity regions at one side;

said channel forming semiconductor region includes a carrier-supplying portion and a carrier-acceleration-injection portion disposed along a carrier transport direction said carrier-supplying portion supplies to said carrier-acceleration-injection portion carriers supplied by another one out of said first and second impurity regions at another side;

said carrier-acceleration-injection portion makes local injection of carriers supplied from said carrier-supplying portion into said gate insulator in the vicinity of the adjacent said one out of said first and second impurity regions at one side to which said accelerated electrical potential is supplied;

said carrier-acceleration-injection portion comprises a first carrier-acceleration-injection portion formed adjacent to said first impurity region and a second carrier-acceleration-injection portion adjacent to said second impurity region wherein said carrier-supplying portion is disposed between said first carrier-acceleration-injection portion and said second carrier-acceleration-injection portion;

said gate insulator is comprised of a first gate insulator disposed on said carrier-supplying portion and two second sate insulators disposed on said first carrier-acceleration-injection portion and said second carrier-acceleration-injection portion, respectively;

said carrier trapping means is in said second gate insulators;

said acceleration-electrical supplying means supplies an acceleration-electrical potential to said second impurity region when injecting carriers from said second carrier-acceleration-injection portion into a second one of said second gate insulators and to said first impurity region when injecting carriers from said first carrier-acceleration-injection portion into a first one of said second gate insulators; and said gate electrode is comprised of a first gate electrode and two second gate electrodes wherein said first gate electrode, a first one of said second gate electrodes and a second one of said second sate electrodes are insulated from each other, wherein said first sate electrode is disposed above said carrier-supplying portion through said first gate insulator and said first one of said second gate electrodes is disposed above said first carrier-acceleration-injection portion through said first one of said second gate insulators, and wherein said second one of said second gate electrodes is disposed above said second carrier-acceleration-injection portion through said second one of said second gate insulators;

wherein carrier injection from said second carrier-acceleration-injection portion into said second one of said second gate insulators comprises:

a process to supply to said second impurity region an acceleration-electrical potential more than $V_B-2\phi_{F2}$ ($\phi_{F2}$: a Fermi-level in the carrier-acceleration-injection-portion) so that energy capable of getting over a potential barrier VB to be formed at an interface with said second carrier-acceleration-injection portion and said second one of said second gate insulators may be supplied to the carrier concerned;

a process to supply an electrical potential for attracting carriers to said second one of said second gate electrodes;

a process to supply carriers from said first impurity region to said carrier-supplying portion through said first carrier-acceleration-injection portion; and a process to move to said second carrier acceleration-injection-portion carriers supplied to said carrier-supplying portion and wherein carrier injection from said first carrier-acceleration-injection portion into said first one of said second gate insulators comprises:

a process to supply to said first impurity region an acceleration-electrical potential more than $V_B-2\phi_{F2}$ so that energy capable of overcoming an electrical potential barrier $V_B$ to be formed at an interface with said first carrier-acceleration-injection portion and said first one of said second gate insulators may be supplied to said carrier concerned;

a process to supply an electrical potential for attracting a carrier to said first one of said second gate electrodes;

a process to supply carriers from said second impurity region to said carrier-supplying portion through said second carrier-acceleration-injection portion; and a process to move to said first carrier-acceleration-injection portion carriers supplied to said carrier-supplying portion.

7. A method of programming the nonvolatile memory cell according to claim 6 wherein carrier injection from said second carrier-acceleration-injection portion to said second one of said second gate insulators comprises steps of:

supplying to said first one of said second gate electrodes an electrical potential which is larger than a gate threshold voltage;

supplying to said first gate electrode an electrical potential for inducing a channel which is larger than said gate threshold voltage;

predetermining electrical potential of said first impurity region to a first electrical potential which is smaller than said acceleration-electrical potential and which is larger than a value obtained by deducting said threshold voltage from said electrical potential for inducing a channel; and changing electrical potential of said first impurity region to said first electrical potential or a second electrical potential less than said value which is obtained by deducting said gate threshold voltage from said electric potential for inducing a channel to select programming information and wherein carrier injection from a first carrier-acceleration-injection portion into said first one of said second gate insulators comprises steps of:

supplying to said second one of said second gate electrodes an electrical potential which is larger than said gate threshold voltage;

supplying to said first gate electrode an electrical potential for inducing a channel which is larger than said gate threshold voltage;

predetermining an electrical potential of said second impurity region to a first electrical potential which is smaller than said acceleration-electrical potential and which is larger than said value obtained by deducting said threshold voltage from said electrical potential for inducing a channel; and changing electrical potential of said second impurity region to said first electrical potential or a second electrical potential less than said value obtained by deducting the gate threshold voltage from said electrical potential for inducing a channel to select programming information.

8. A method of programming the nonvolatile memory cell according to claim 6 wherein said electrical potential for attracting a carrier is more than $V_B - \phi_{GB}$ ($\phi_{GB}$: a work function difference between a gate electrode and carrier-acceleration-injection portion).

9. A method of programming the nonvolatile memory cell according to claim 6 wherein carriers are supplied from one of said impurity regions to said carrier-supplying portion by forward-biasing said one of said impurity regions.

10. A method of programming the nonvolatile memory cell according to claim 6 wherein a carrier is supplied from one of said impurity regions to said carrier-supplying portion by inducing a channel in a surface of said carrier-supplying portion.

11. A method of programming the nonvolatile memory cell according to claim 7 wherein said second electrical potential is selected out of a plurality of levels of electrical potential.

12. A method of reading stored information from one of a pair of second gate insulators in a nonvolatile memory cell wherein first and second impurity regions of opposite conductivity type are formed in a main surface of a substrate and separated therebetween by a channel forming semiconductor region of one conductivity type in said main surface of said substrate and a gate electrode is formed on a gate insulator on said channel forming semiconductor region, carriers being injected and stored in a carrier trapping means of said gate insulator further comprising:

provided is an acceleration-electrical potential supplying means to selectively supply an acceleration-electrical potential to one out of the first and second impurity regions at one side;

said channel forming semiconductor region includes a carrier-supplying portion and a carrier-acceleration-injection portion disposed along a carrier transport direction said carrier-supplying portion supplies to said carrier-acceleration-injection portion carriers supplied by another one out of said first and second impurity regions at another side;

said carrier-acceleration-injection portion makes local injection of carriers supplied from said carrier-supplying portion into said gate insulator in the vicinity of the adjacent said one out of said first and second impurity regions at one side to which said accelerated electrical potential is supplied;

said carrier-acceleration-injection portion comprises a first carrier-acceleration-injection portion formed adjacent to said first impurity region and a second carrier-acceleration-injection portion adjacent to said second impurity region wherein said carrier-supplying portion is disposed between said first carrier-acceleration-injection portion and said second carrier-acceleration-injection portion;

said gate insulator is comprised of a first gate insulator disposed on said carrier-supplying portion and two second gate insulators disposed on said first carrier-acceleration-injection portion and said second carrier-acceleration-injection portion, respectively;

said carrier trapping means is in said second gate insulators;

said acceleration-electrical supplying means supplies an acceleration-electrical potential to said second impurity region when injecting carriers from said second carrier-acceleration-injection portion into a second one of said second gate insulators and to said first impurity region when injecting carriers from said first carrier-acceleration-injection portion into a first one of said second gate insulators; and said gate electrode is comprised of a first gate electrode and two second gate electrodes wherein said first gate electrode, a first one of said second gate electrodes and a second one of said second gate electrodes are insulated from each other, wherein said first gate electrode is disposed above said carrier-supplying portion through said first gate insulator and said first one of said second gate electrodes is disposed above said first carrier-acceleration-injection portion through said first one of said second gate insulators, and wherein said second one of said second gate electrodes is disposed above said second carrier-acceleration-injection portion through said second one of said second gate insulators;

wherein a reverse-biasing electrical potential is supplied to one impurity region out of said first and second impurity regions being further from said one of said pair of second gate insulators from which information is to be read than said other impurity region wherein said reverse-biasing electrical potential is smaller than $V_B - 2\phi_{F2}$ ($V_B$: potential barrier formed at the interface with the second gate insulator and carrier-acceleration-injection portion; ($\phi_{F2}$: a Fermi-level of the carrier-acceleration-injection portion) and is larger than said electrical potential in the other one out of said first and second impurity regions;

an electrical potential which is larger than a gate threshold voltage of said first gate electrode is supplied to said first gate electrode; and an electrical potential which is larger than a maximum value of a plurality of programmed gate threshold voltages of said first and second one of said second gate electrode is supplied to each of said first and second one of said second gate electrode to detect the electrical potential of said other impurity region.

13. A method of programming a nonvolatile memory cell wherein said nonvolatile memory cell comprises:

first and second impurity regions of opposite conductivity type formed in a main surface of a substrate and separated therebetween by a channel forming semiconductor region of one conductivity type in said main surface of said substrate wherein a carrier-supplying portion is disposed adjacent to said first impurity region and a carrier-acceleration-injection portion is disposed adjacent to said second impurity region; and a gate electrode formed on a gate insulator on said channel forming semiconductor region wherein said gate electrode integrally covers said carrier-supplying portion and said carrier-acceleration-injection portion;

wherein said method of programming said cell comprises the steps of:

supplying to said second impurity region acceleration-electrical potential more than $V_B - 2\phi_{F2}$ ($\phi_{F2}$: a Fermi-level in the carrier-acceleration-injection portion) so that energy capable of getting over a potential barrier $V_B$ to be formed at an interface with said carrier-acceleration-injection portion and said gate insulator thereover may be supplied to said carrier concerned;

supplying carriers from said first impurity region to said carrier-supplying portion in said channel forming semiconductor region; and moving to said carrier-acceleration-injection portion carriers which are supplied to said carrier-supplying portion whereby carriers are injected and stored in a carrier trapping means of said gate insulator.

14. A method of reading stored information in a nonvolatile memory cell wherein said nonvolatile memory cell comprises:

first and second impurity regions of opposite conductivity type formed in a main surface of a substrate and separated therebetween by a channel forming semiconductor region of one conductivity type in said main surface of said substrate wherein a carrier-supplying portion is disposed adjacent to said first impurity region and a carrier-acceleration-injection portion is disposed adjacent to said second impurity region; and a gate electrode formed on a gate insulator on said channel forming semiconductor region wherein said gate electrode integrally covers said carrier-supplying portion and said carrier-acceleration-injection portion;

wherein said method of reading stored information in said cell comprises the steps of:

supplying to said first impurity region reverse-biasing electrical potential which is smaller than $V_B - 2\phi_{F2}$ ($V_B$: electrical potential barrier formed at the interface with the gate insulator and carrier-acceleration-injection portion; $\phi_{F2}$: Fermi-level of the carrier-acceleration-injection portion) and which is larger than said electrical potential in said second impurity region, and supplying to said gate electrode to detect said electrical potential of said first impurity region an electrical potential which is larger than a maximum value of a plurality of programmed gate threshold voltages.

* * * * *